(12) United States Patent
Wang et al.

(10) Patent No.: US 12,211,812 B2
(45) Date of Patent: Jan. 28, 2025

(54) SEMICONDUCTOR STORAGE DEVICE AND METHOD FOR FABRICATING SEMICONDUCTOR STORAGE DEVICE

(71) Applicant: Kioxia Corporation, Tokyo (JP)

(72) Inventors: Yuanting Wang, Yokkaichi Mie (JP); Masato Shini, Mie Mie (JP); Minoru Oda, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/462,613

(22) Filed: Aug. 31, 2021

(65) Prior Publication Data

US 2022/0302056 A1    Sep. 22, 2022

(30) Foreign Application Priority Data

Mar. 16, 2021    (JP) .................................. 2021-042688

(51) Int. Cl.
     *H01L 25/065*      (2023.01)
     *H01L 23/00*      (2006.01)
     (Continued)

(52) U.S. Cl.
     CPC .............. *H01L 24/08* (2013.01); *H01L 24/80* (2013.01); *H01L 25/0657* (2013.01);
     (Continued)

(58) Field of Classification Search
     CPC ..... H01L 24/08; H01L 25/0657; H01L 24/80; H01L 25/18; H01L 25/50;
     (Continued)

(56) References Cited

U.S. PATENT DOCUMENTS

| 6,069,082 A | 5/2000 | Wong et al. |
| 6,424,042 B1 | 7/2002 | Kitani |

(Continued)

FOREIGN PATENT DOCUMENTS

| CN | 112420647 A | 2/2021 |
| JP | 2001-044195 A | 2/2001 |

(Continued)

OTHER PUBLICATIONS

Park et al., "Overview of Methods for Characterization of Pattern Dependencies in Copper CMP", Proc. CMP-MIC, Mar. 2000, pp. 196-205.

*Primary Examiner* — Thanh Y. Tran
(74) *Attorney, Agent, or Firm* — Foley & Lardner LLP

(57) ABSTRACT

A semiconductor storage device includes a first substrate, a second substrate, a first stacked body, and a second stacked body. The first stacked body is provided between the first substrate and the second substrate and includes a first trace, a first pad connected to the first trace, and a first insulator. The second stacked body is provided between the first stacked body and the second substrate and includes a second trace, a second pad connected to the second trace, and a second insulator. The first pad includes a plurality of first electrode portions connected to the first trace. The first insulator is provided between the plurality of first electrode portions. The plurality of first electrode portions are bonded to the second pad.

15 Claims, 17 Drawing Sheets

(51) Int. Cl.
*H01L 25/00* (2006.01)
*H01L 25/18* (2023.01)

(52) U.S. Cl.
CPC .............. *H01L 25/18* (2013.01); *H01L 25/50* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC . H01L 2224/08145; H01L 2224/80895; H01L 2224/80896; H01L 2924/1431; H01L 2924/14511
See application file for complete search history.

(56) References Cited

U.S. PATENT DOCUMENTS

| | | | |
|---|---|---|---|
| 9,437,572 | B2 | 9/2016 | Chen et al. |
| 2010/0096760 | A1 | 4/2010 | Yu et al. |
| 2011/0097896 | A1 | 4/2011 | Daamen et al. |
| 2014/0145338 | A1 | 5/2014 | Fujii et al. |
| 2018/0190580 | A1* | 7/2018 | Haba ...................... H01G 4/228 |
| 2020/0279841 | A1 | 9/2020 | Sanuki |
| 2020/0402903 | A1 | 12/2020 | Chen et al. |
| 2021/0057376 | A1* | 2/2021 | Nakanishi ................ H01L 24/03 |
| 2021/0082877 | A1* | 3/2021 | Uchiyama ............... H01L 25/50 |
| 2021/0375790 | A1* | 12/2021 | Oda ........................ H01L 24/80 |
| 2022/0068858 | A1* | 3/2022 | Horiuchi ................. H01L 25/50 |
| 2022/0077089 | A1* | 3/2022 | Watanabe ............. H01L 23/562 |
| 2022/0084970 | A1* | 3/2022 | Tomimatsu ............. H01L 24/09 |

FOREIGN PATENT DOCUMENTS

| | | |
|---|---|---|
| JP | 2005-538544 A | 12/2005 |
| JP | 2010-103533 A | 5/2010 |
| JP | 2011-049270 A | 3/2011 |
| TW | 201841336 A | 11/2018 |
| TW | 202034318 A | 9/2020 |
| WO | WO-2012/161044 A1 | 11/2012 |

* cited by examiner

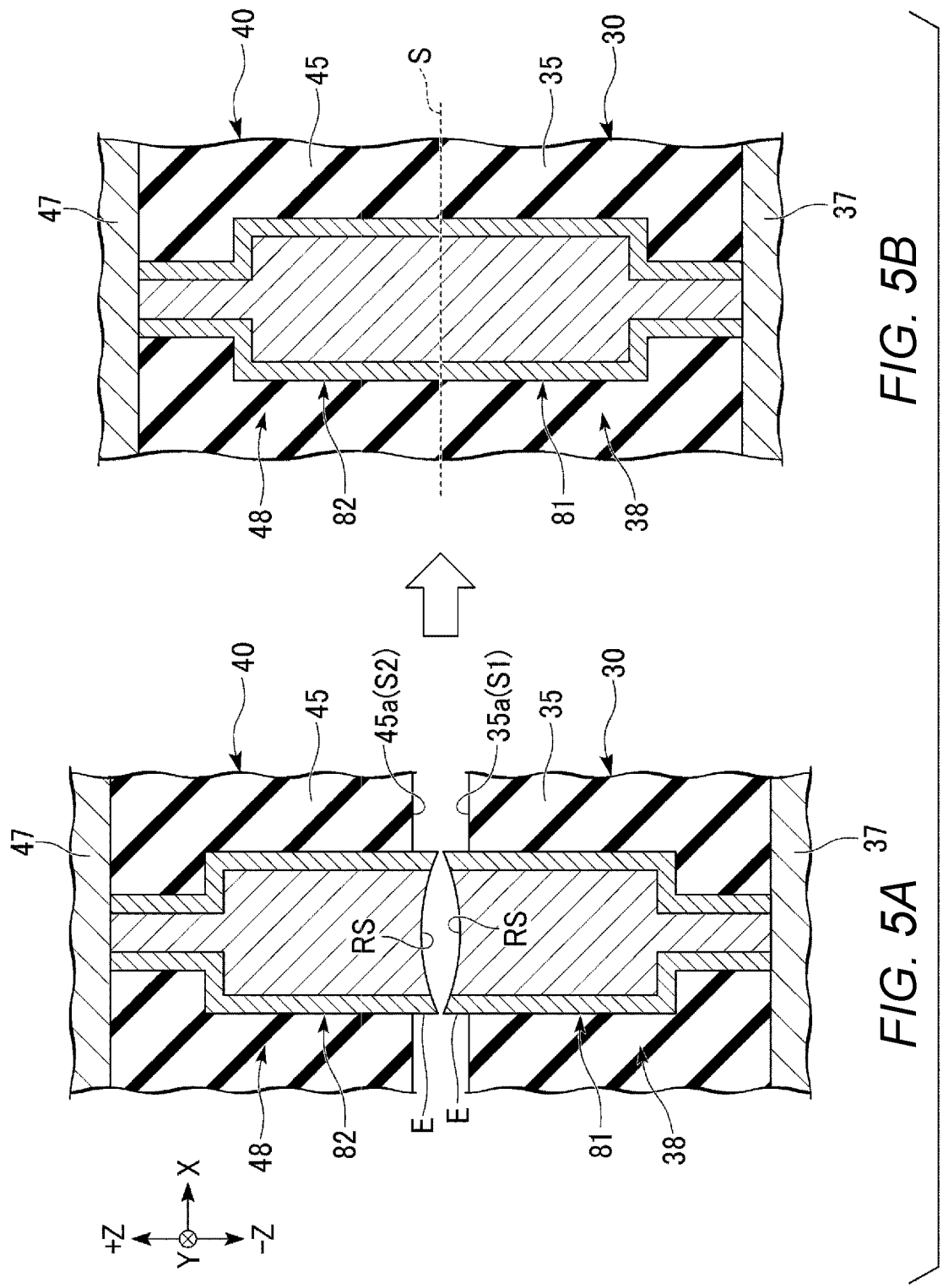

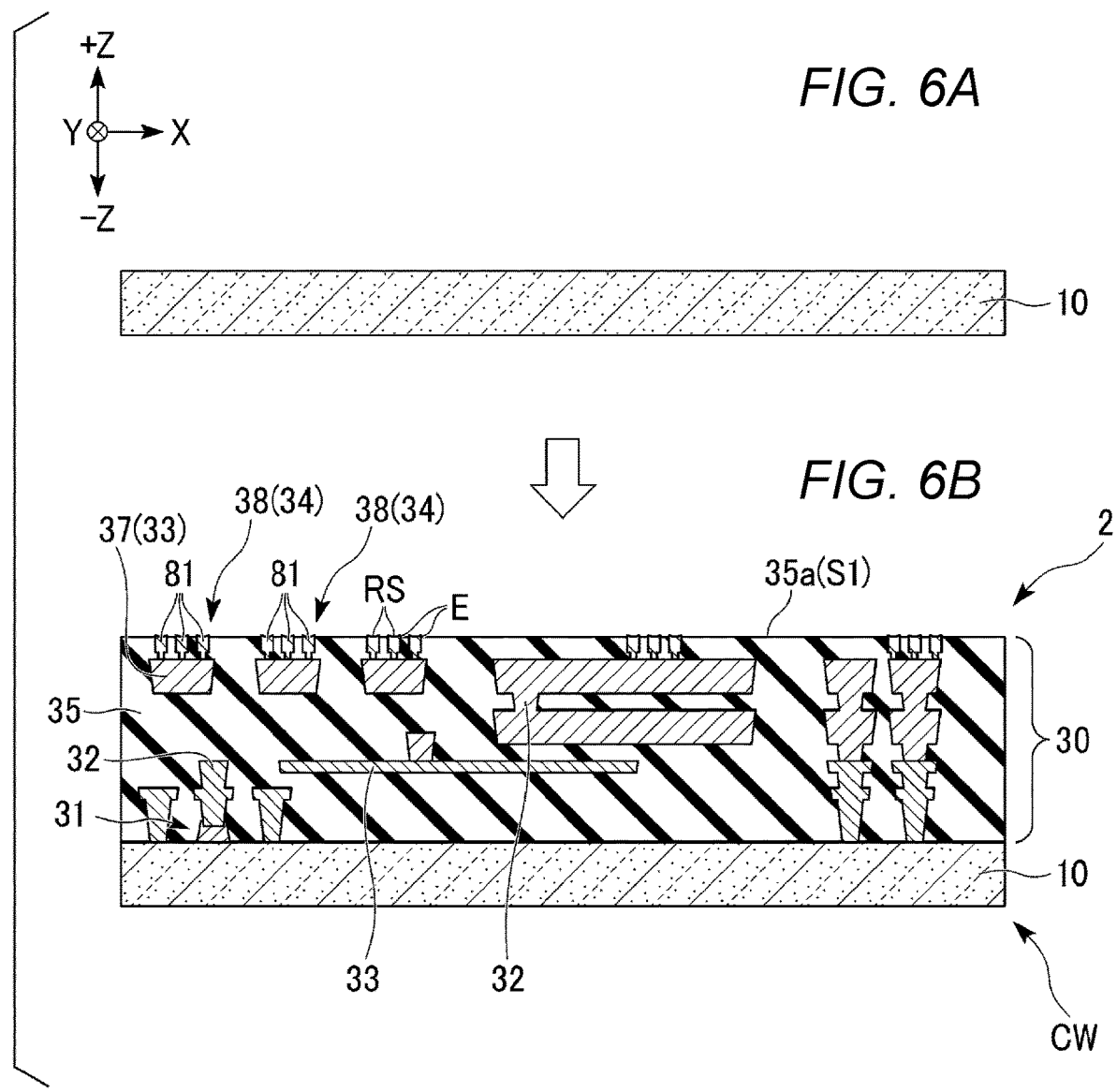

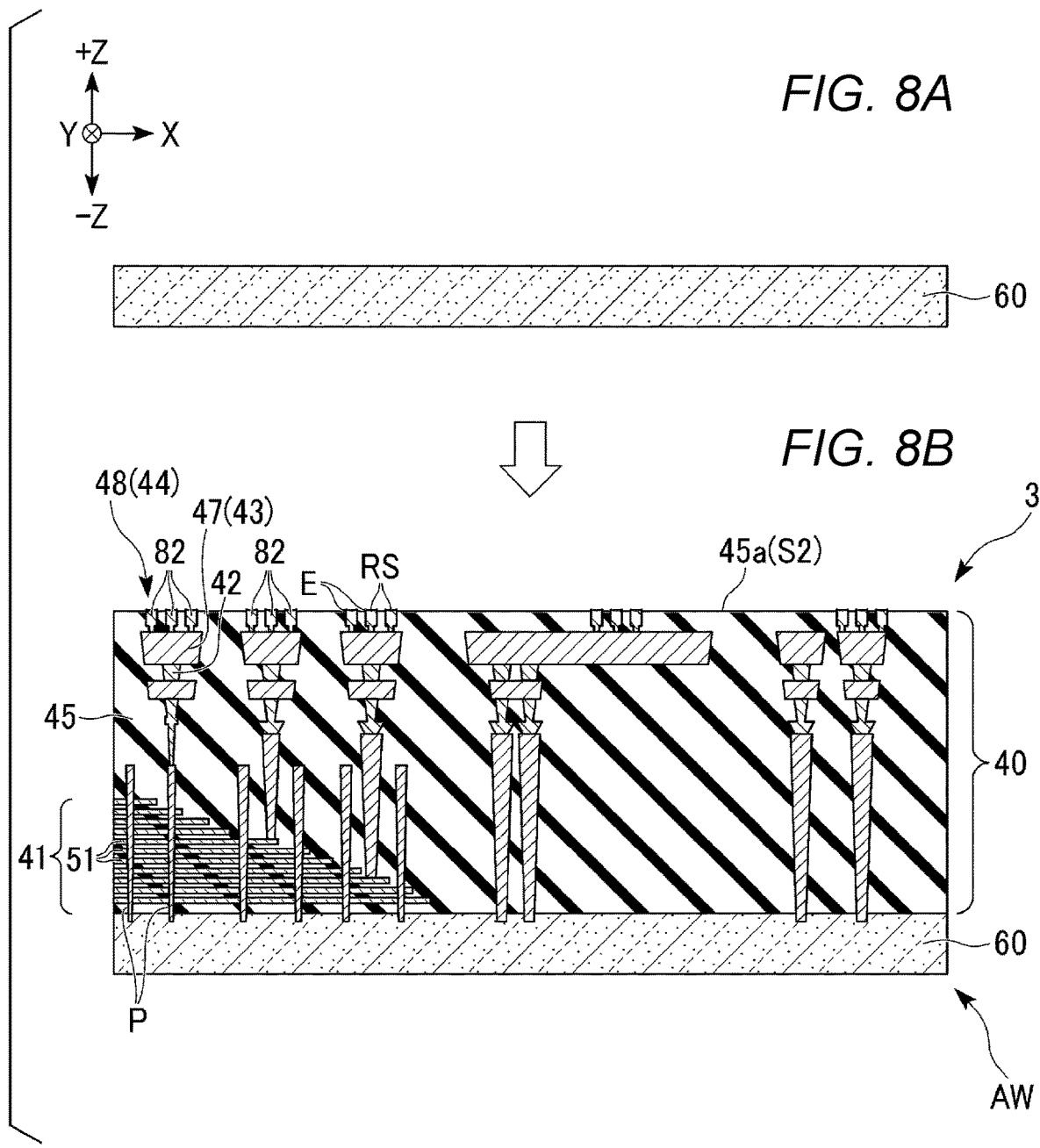

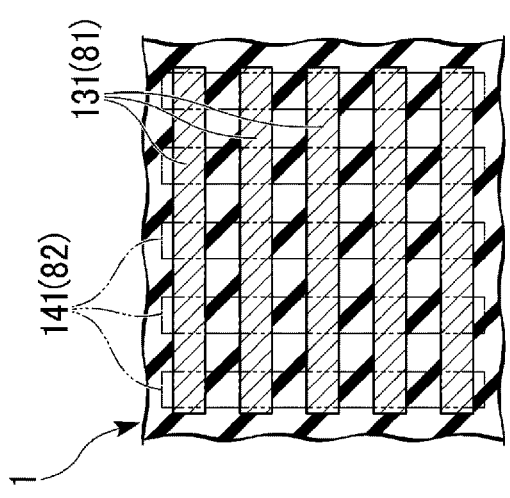
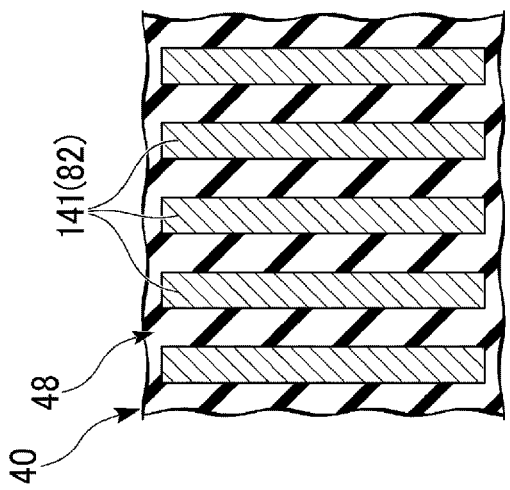
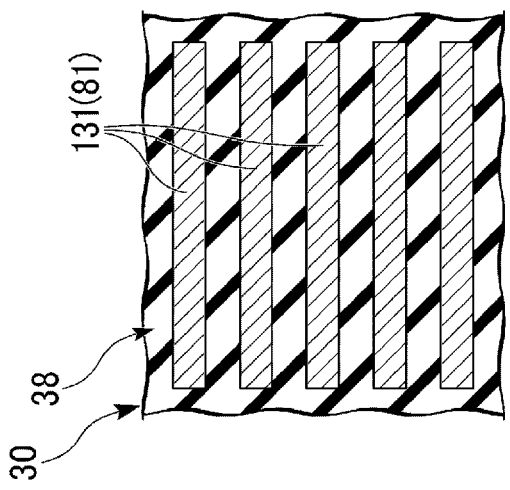
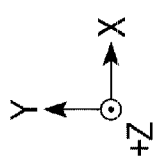
FIG. 19A  FIG. 19B  FIG. 19C

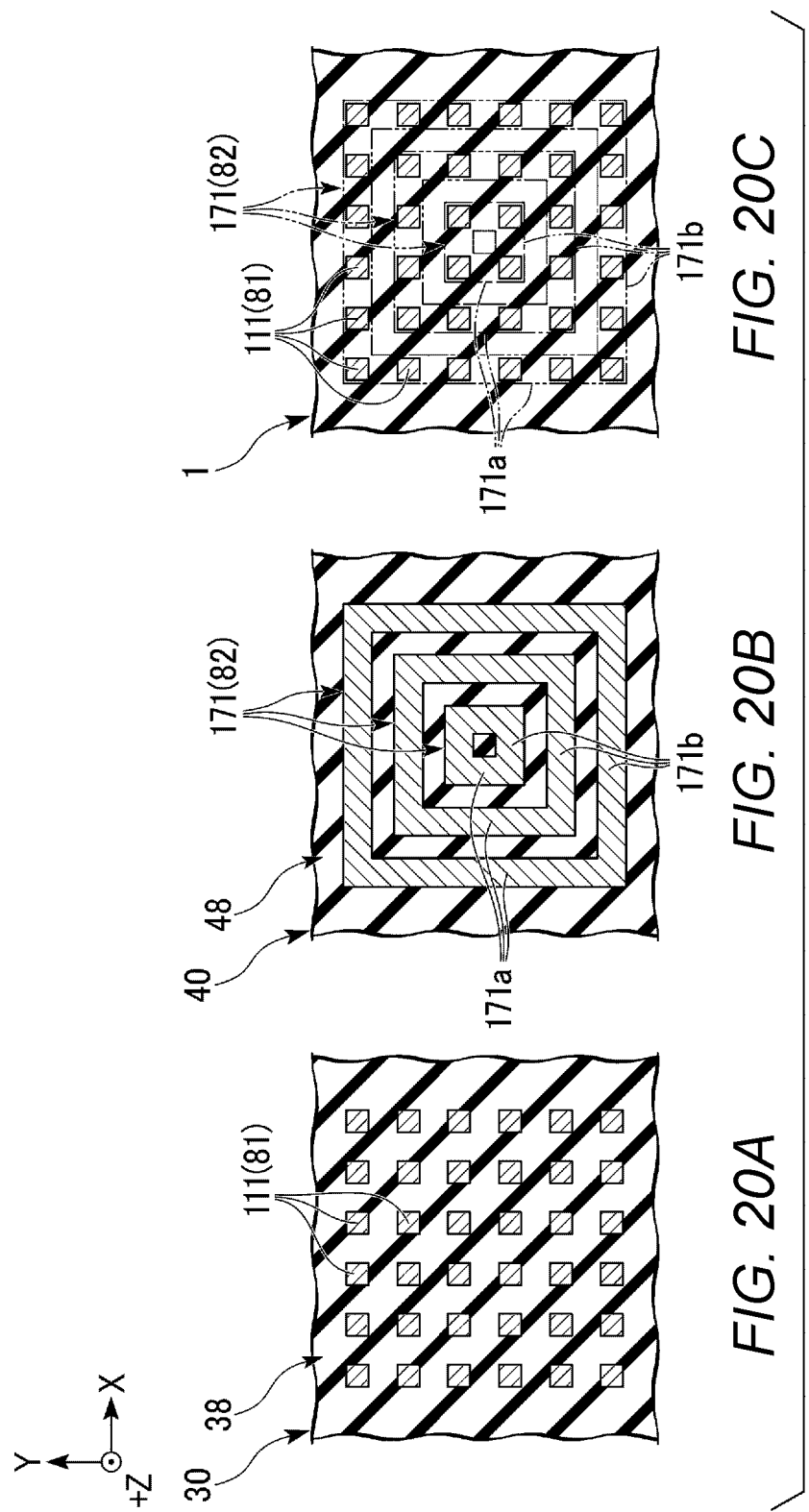

SEMICONDUCTOR STORAGE DEVICE AND METHOD FOR FABRICATING SEMICONDUCTOR STORAGE DEVICE

CROSS-REFERENCE TO RELATED APPLICATION(S)

This application is based upon and claims the benefit of priority from Japanese Patent Application No. 2021-042688, filed Mar. 16, 2021, the entire contents of which are incorporated herein by reference.

FIELD

Embodiments described herein relate generally to a semiconductor storage device and a method for fabricating the semiconductor storage device.

BACKGROUND

A semiconductor storage device that is fabricated by bonding a plurality of wafers together is known.

DESCRIPTION OF THE DRAWINGS

FIGS. 5A and 5B are sectional views showing the state of an electrode portion of a first stacked body and an electrode portion of a second stacked body when the first stacked body and the second stacked body of at least one embodiment are bonded together.

FIGS. 6A and 6B are sectional views showing a method for fabricating the semiconductor storage device of at least one embodiment.

FIGS. 8A and 8B are sectional views showing the method for fabricating the semiconductor storage device of at least one embodiment.

FIGS. 19A to 19C are sectional views showing the shape of each of a plurality of electrode portions of an eighth example of at least one embodiment.

FIGS. 20A to 20C are sectional views showing the shape of each of a plurality of electrode portions of a ninth example of at least one embodiment.

DETAILED DESCRIPTION

Figure 1:
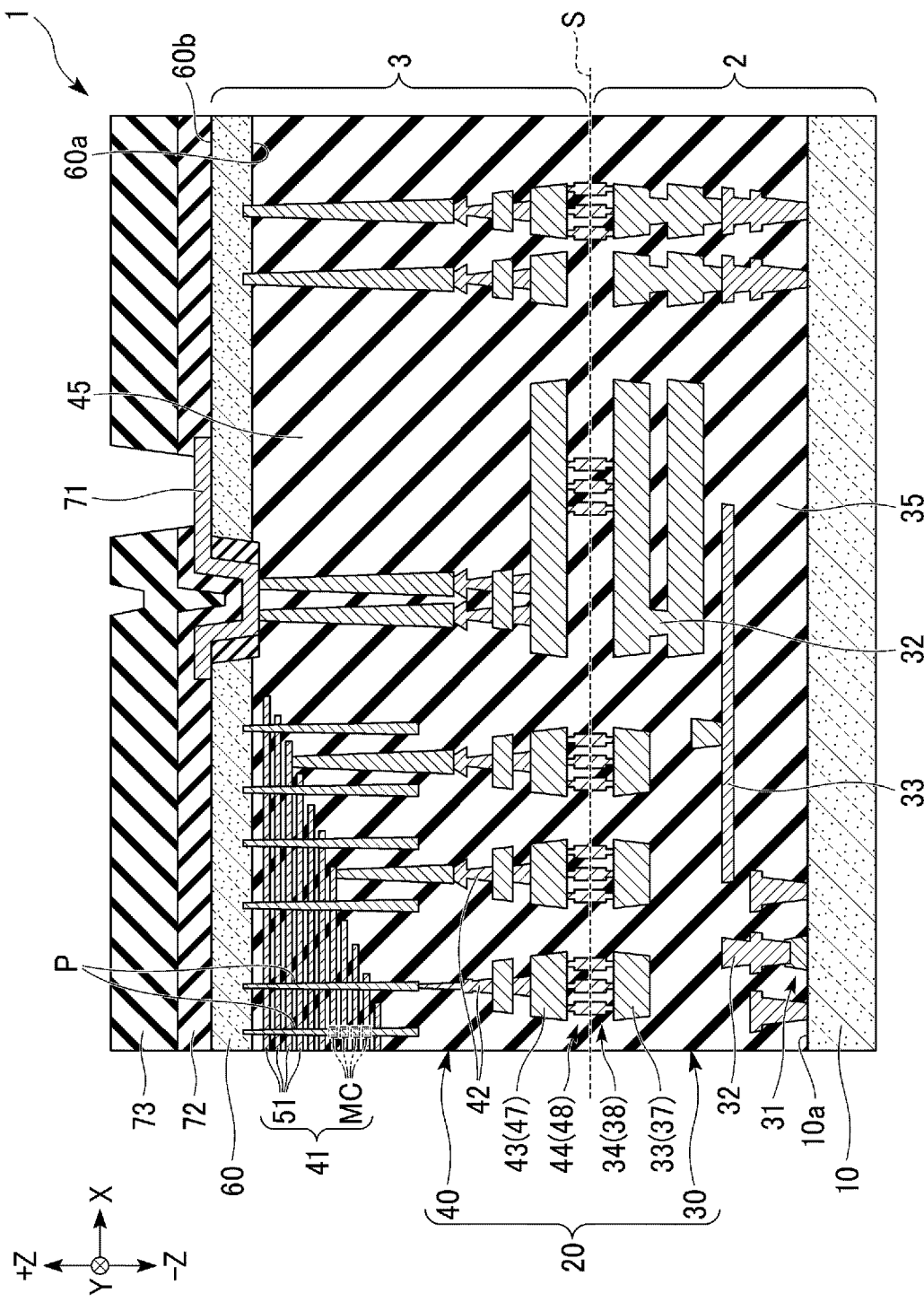
FIG. 1 is a sectional view showing the configuration of a semiconductor storage device of at least one embodiment.

Embodiments provide a semiconductor storage device and a method for fabricating the semiconductor storage device, the device and the method that can improve electrical characteristics.

In general, according to at least one embodiment, a semiconductor storage device includes a first substrate, a second substrate, a first stacked body, and a second stacked body. The second substrate is separated from the first substrate in a first direction that is a thickness direction of the first substrate. The first stacked body is provided between the first substrate and the second substrate and includes a first trace, a first pad connected to the first trace, and a first insulator. The second stacked body is provided between the first stacked body and the second substrate and includes a second trace, a second pad connected to the second trace, and a second insulator. The first pad includes a plurality of first electrode portions that are separated from one another in a second direction intersecting the first direction and are connected to the first trace. The first insulator is provided between the plurality of first electrode portions. The plurality of first electrode portions are bonded to the second pad.

Hereinafter, a semiconductor storage device 1 of at least one embodiment will be described with reference to the drawings. In the following description, elements having the same or similar function are denoted by the same reference sign and overlapping explanations of these elements are sometimes omitted. A case where a component is "connected" to another component is not limited to a case where a component is physically connected to another component and also includes a case where a component is electrically connected to another component. That is, a case where a component is "connected" to another component is not limited to a case where a component is in direct contact with another component and also includes a case where a different component is interposed between a component and another component. An "annular" shape is not limited to a ring-like shape and also includes a rectangular ring-like shape. A case where something is "parallel to" something, a case where something is "orthogonal to" something, and a case where something is "the same as" something also include a case where something is "approximately parallel to" something, a case where something is "approximately orthogonal to" something, and a case where something is "almost the same as" something, respectively.

First, an X direction, a Y direction, a +Z direction, a −Z direction are defined. The X direction and the Y direction are directions along a front surface 10a of a first substrate 10 (see FIG. 1) which will be described later. The Y direction is a direction intersecting (for example, orthogonal to) the X direction. The +Z direction and the −Z direction are each a direction intersecting (for example, orthogonal to) the X direction and the Y direction and are each a thickness direction of the first substrate 10. The +Z direction is a direction toward a second substrate 60 (see FIG. 1) from the first substrate 10. The −Z direction is a direction opposite to the +Z direction. When the +Z direction and the −Z direction are not distinguished from each other, the +Z direction and the −Z direction are simply referred to as a "Z direction". In the following description, the "+Z direction" is sometimes referred to as "on" or "above" and the "−Z direction" is sometimes referred to as "below". It is to be noted that these expressions are used for the sake of convenience and do not define the direction of gravity. The Z direction is one example of a "first direction". One of the X direction and the Y direction is one example of a "second direction" and the other is one example of a "third direction".

Embodiment

1. Overall Configuration of the Semiconductor Storage Device

First, the overall configuration of the semiconductor storage device 1 of the embodiment will be described. The semiconductor storage device 1 is a nonvolatile semiconductor storage device and is NAND flash memory, for example.

FIG. 1 is a sectional view showing the configuration of the semiconductor storage device 1. The semiconductor storage device 1 is, for example, three-dimensional memory configured with a circuit chip 2 and an array chip 3 which are bonded together at a bonding surface S. The circuit chip 2 is one example of a "first chip". The array chip 3 is one example of a "second chip". The circuit chip 2 includes a control circuit (a logic circuit) that controls the operation of the array chip 3. Hereinafter, this semiconductor storage device 1 will be described in detail.

The semiconductor storage device 1 includes the first substrate 10, a stacked body 20, the second substrate 60, and insulating layers 72 and 73, for example.

The first substrate 10 is a substrate in the circuit chip 2. The first substrate 10 is a silicon substrate, for example. The first substrate 10 has the front surface 10a on which the stacked body 20 is stacked. A source region and a drain region of a transistor 31 (which will be described later) in the stacked body 20 is provided in the first substrate 10.

The stacked body 20 is located between the first substrate 10 and the second substrate 60 in the Z direction. The stacked body 20 includes a first stacked body 30 and a second stacked body 40. The first stacked body 30 is provided on the first substrate 10. The first stacked body 30 is located between the first substrate 10 and the second stacked body 40 in the Z direction. In at least one embodiment, the circuit chip 2 is configured with the first substrate 10 and the first stacked body 30. The first stacked body 30 includes a plurality of transistors 31 (only one of which is shown in FIG. 1 for simplicity), a plurality of contact plugs 32, a plurality of traces 33, a plurality of pads 34, and a first insulator 35.

The transistors 31 are provided on the first substrate 10. The transistors 31 are connected to the contact plugs 32. The transistors 31 are electrically connected to a memory cell array 41 or an external connection pad 71 via the contact plugs 32 and 42, the traces 33 and 43, and the pads 34 and 44, which are provided in the stacked body 20. The transistors 31 control the memory cell array 41, for example.

The contact plugs 32, the traces 33, and the pads 34 electrically connect the plurality of transistors 31 and the second stacked body 40. The contact plugs 32, the traces 33, and the pads 34 are formed of a conductive material such as copper (Cu) or aluminum (Al). The contact plugs 32 are traces extending in the Z direction and electrically connecting different layers in the first stacked body 30. The traces 33 are traces extending in the X direction or the Y direction.

The pads 34 are electrodes for connection provided in the first stacked body 30. The pads 34 include an internal pad provided inside the first stacked body 30 and a bonding pad 38 exposed on the front surface (the bonding surface S) of the first stacked body 30. The bonding pad 38 is one example of a "first pad". Of the plurality of traces 33, a trace 37 connected to the bonding pad 38 is one example of a "first trace". The bonding pad 38 will be described later in detail.

The first insulator 35 is provided between the plurality of contact plugs 32, the plurality of traces 33, and the plurality of pads 34 and electrically insulates these elements from one another. The first insulator 35 is formed of tetraethyl orthosilicate ($Si(OC_2H_5)_4$, TEOS), silicon oxide ($SiO_2$), silicon nitride (SiN), or the like, for example.

The second stacked body 40 is provided on the first stacked body 30. The second stacked body 40 is located between the first stacked body 30 and the second substrate 60 in the Z direction. In at least one embodiment, the array chip 3 is configured with the second substrate 60 and the second stacked body 40. The second stacked body 40 includes the memory cell array 41, a plurality of contact plugs 42, a plurality of traces 43, a plurality of pads 44, and a second insulator 45.

The memory cell array 41 is provided below the second substrate 60. The memory cell array 41 is stacked on the second substrate 60 at the time of fabrication (see FIGS. 8A and 8B). The memory cell array 41 includes a plurality of conductive layers 51 and a plurality of memory pillars P. The plurality of conductive layers 51 and the plurality of memory pillars P are connected to the contact plugs 42.

The plurality of conductive layers 51 are formed of, for example, tungsten (W) or polysilicon (Poly-Si) doped with impurities. The plurality of conductive layers 51 are stacked in the Z direction with interlayer insulating films 45b (see FIG. 2), which are provided in the second insulator 45, sandwiched therebetween. One or two conductive layers 51, which are located on the side where the first stacked body 30 is located (the −Z direction side), of the plurality of conductive layers 51 function as drain-side select gate lines SGD. One or two conductive layers 51, which are located on the side where the second substrate 60 is located (the +Z direction side), of the plurality of conductive layers 51 function as source-side select gate lines SGS. The remaining conductive layers 51, which are located between the drain-side select gate line SGD and the source-side select gate line SGS, of the plurality of conductive layers 51 function as a plurality of word lines WL.

The plurality of memory pillars P extend in the Z direction and pass through the drain-side select gate line SGD, the plurality of word lines WL, and the source-side select gate line SGS. A memory cell MC is formed at each of intersections of the plurality of word lines WL and the plurality of memory pillars P. As a result, the plurality of memory cells MC are three-dimensionally arranged with space left therebetween in the X direction, the Y direction, and the Z direction. The memory cell MC will be described later in detail.

The contact plugs 42, the traces 43, and the pads 44 electrically connect the memory cell array 41 or the external connection pad 71, which will be described later, and the first stacked body 30. The contact plugs 42, the traces 43, and the pads 44 are formed of a conductive material such as copper or aluminum. The contact plugs 42 are traces extending in the Z direction and electrically connecting different layers in the second stacked body 40. The traces 43 are traces extending in the X direction or the Y direction.

The pads 44 are electrodes for connection provided in the second stacked body 40. The pads 44 include an internal pad provided inside the second stacked body 40 and a bonding pad 48 exposed on the front surface (the bonding surface S) of the second stacked body 40. In a state in which the first stacked body 30 and the second stacked body 40 are stacked, the bonding pad 48 of the second stacked body 40 is provided on the bonding pad 38 of the first stacked body 30 and bonded to the bonding pad 38 of the first stacked body 30. The bonding pad 48 is one example of a "second pad". Of the plurality of traces 43, a trace 47 connected to the bonding pad 48 is one example of a "second trace". The bonding pad 48 will be described below in detail.

The second insulator 45 is provided between the plurality of contact plugs 42, the plurality of traces 43, and the plurality of pads 44 and electrically insulates these elements from one another. The second insulator 45 is formed of TEOS, silicon oxide, silicon nitride, or the like, for example.

The second substrate 60 is provided above the second stacked body 40. The second substrate 60 is separated from the first substrate 10 in the Z direction. The second substrate 60 is a substrate in the array chip 3. The second substrate 60 is a silicon substrate, for example. A conductive region functioning as a source line of the memory cell array 41 is provided in the second substrate 60. The second substrate 60 has a first surface 60a facing the memory cell array 41 and a second surface 60b located on the side opposite to the first surface 60a. The external connection pad 71 is provided on the second surface 60b. The external connection pad 71 is provided with an unillustrated external connecting terminal (for example, a solder ball) and electrically connected to the outside of the semiconductor storage device 1 via the external connecting terminal.

The insulating layer 72 is provided on the second substrate 60. The insulating layer 73 is provided on the insulating layer 72. The insulating layers 72 and 73 are passivation films protecting the stacked body 20. The insulating layer 72 is a silicon oxide film, for example. The insulating layer 73 is a polyimide film, for example.

Figure 2:
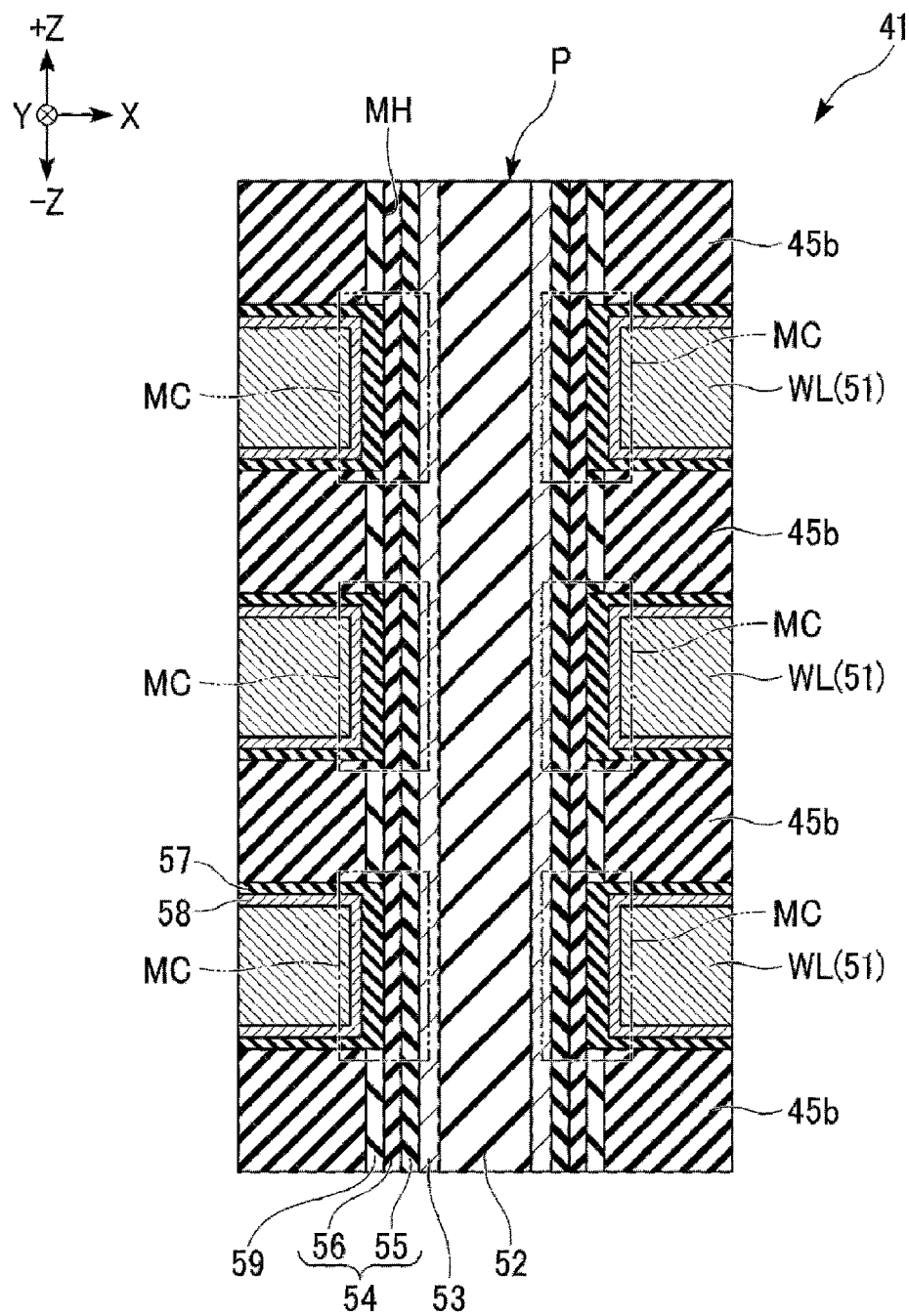
FIG. 2 is a sectional view showing an area near a memory pillar of a memory cell array of at least one embodiment.

FIG. 2 is a sectional view showing an area near the memory pillar P of the memory cell array 41. As shown in FIG. 2, the plurality of word lines WL are stacked in the Z direction with the interlayer insulating films 45b sandwiched therebetween. The plurality of word lines WL extend in the X direction. The memory cell array 41 has a memory hole MH in which the memory pillar P is provided. The memory pillar P extends in the memory hole MH in the Z direction and passes through the plurality of word lines WL.

The memory pillar P is circular or oval, for example, when viewed from the Z direction. The memory pillar P includes a core insulator 52, a semiconductor body 53, and a memory film 54 in order from inside.

The core insulator 52 is a columnar body extending in the Z direction. The core insulator 52 contains silicon oxide, for example. The core insulator 52 is located on the inside of the semiconductor body 53.

The semiconductor body 53 extends in the Z direction and functions as a channel. The semiconductor body 53 is connected to the conductive region, which functions as a source line, of the second substrate 60. The semiconductor body 53 covers the outer periphery of the core insulator 52. The semiconductor body 53 contains silicon, for example. Silicon is polysilicon obtained by crystallizing amorphous silicon, for example.

The memory film 54 extends in the Z direction. The memory film 54 covers the outer periphery of the semiconductor body 53. The memory film 54 is located between the inner surface of the memory hole MH and the outer side surface of the semiconductor body 53. The memory film 54 includes a tunnel insulating film 55 and a charge storage film 56, for example.

The tunnel insulating film 55 is located between the charge storage film 56 and the semiconductor body 53. The tunnel insulating film 55 contains silicon oxide or silicon oxide and silicon nitride, for example. The tunnel insulating film 55 is a potential barrier between the semiconductor body 53 and the charge storage film 56.

The charge storage film 56 is provided between each of the word lines WL and the interlayer insulating films 45b and the tunnel insulating film 55. The charge storage film 56 contains silicon nitride, for example. An intersection of the charge storage film 56 and the word line WL functions as a memory cell MC. The memory cell MC stores data by the presence or absence of charge in the intersection (a charge storage portion) of the charge storage film 56 and the word line WL or the amount of accumulated charge. The charge storage portion is present between the word line WL and the semiconductor body 53 and surrounded with an insulating material.

A block insulating film 57 and a barrier film 58 may be provided between the word line WL and the interlayer insulating film 45b and between the word line WL and the memory film 54. The block insulating film 57 is an insulating film that prevents back tunneling. Back tunneling is a phenomenon in which a charge returns to the memory film 54 from the word line WL. The block insulating film 57 is a silicon oxide film, a metal oxide film, or a stacked structure film configured with a plurality of stacked insulating films, for example. One example of metal oxide is aluminum oxide. The barrier film 58 is a titanium nitride film or a stacked structure film including titanium nitride and titanium, for example.

A cover insulating film 59 may be provided between the interlayer insulating film 45b and the charge storage film 56. The cover insulating film 59 contains silicon oxide, for example. The cover insulating film 59 protects the charge storage film 56 from etching at the time of processing. The cover insulating film 59 does not necessarily have to be provided, or a part of the cover insulating film 59 may be left between the conductive layer 51 and the charge storage film 56 and used as a block insulating film.

2. Configuration of the Bonding Pad

Next, the configuration of the bonding pads 38 and 48 will be described.

Figure 3:
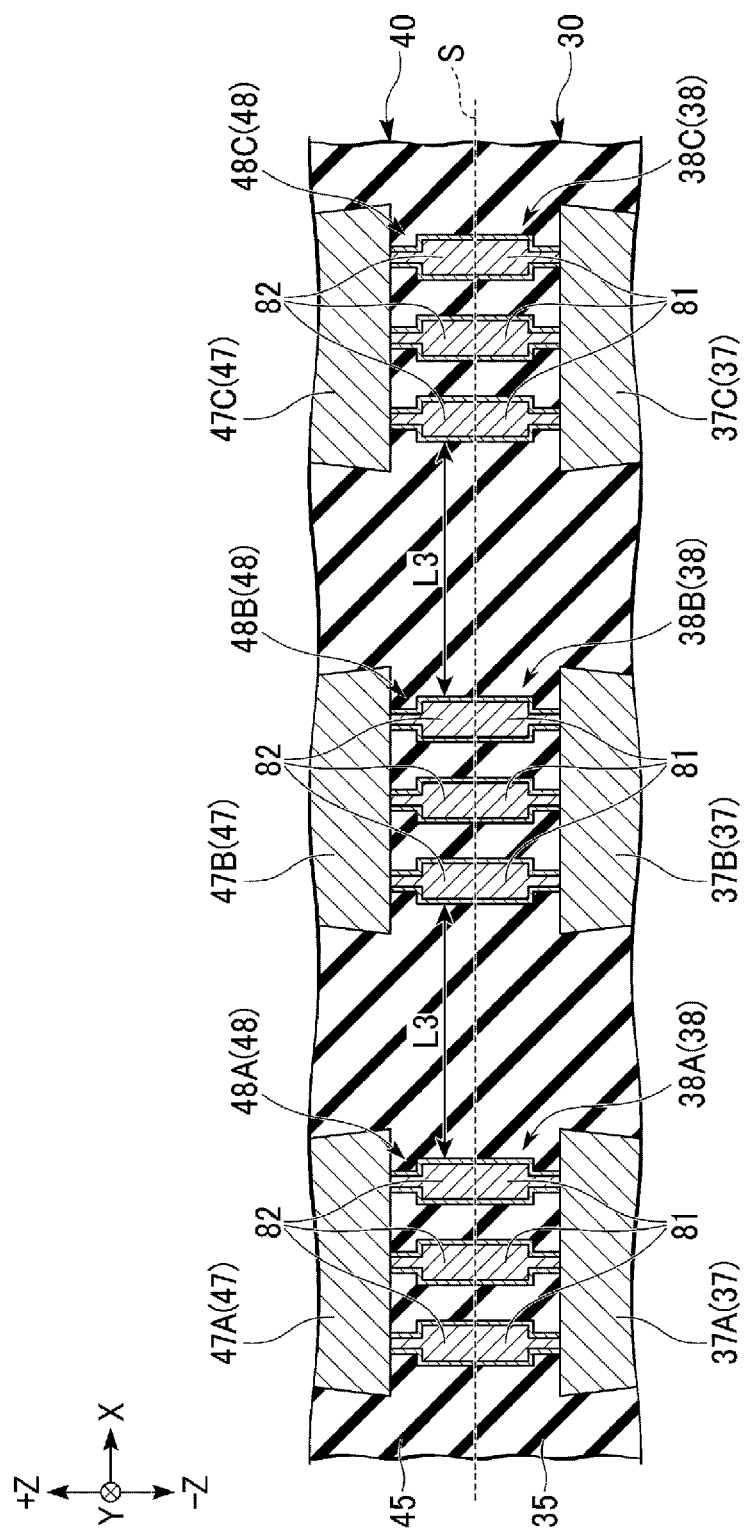
FIG. 3 is a sectional view showing a plurality of bonding pads of at least one embodiment.

FIG. 3 is a sectional view showing a plurality of bonding pads 38 and 48. As shown in FIG. 3, the trace 37 of the first stacked body 30 includes traces 37A, 37B, and 37C which are electrically independent of one another. The first insulator 35 is provided between the traces 37A, 37B, and 37C in the X direction and the Y direction. This electrically insulates the traces 37A, 37B, and 37C from one another. The traces 37A, 37B, and 37C may be at different potentials. In the following description, when the traces 37A, 37B, and 37C are not distinguished from one another, the traces 37A, 37B, and 37C are referred to as the "trace 37".

The bonding pad 38 of the first stacked body 30 includes a bonding pad 38A connected to the trace 37A, a bonding pad 38B connected to the trace 37B, and a bonding pad 38C connected to the trace 37C. The first insulator 35 is provided between the bonding pads 38A, 38B, and 38C in the X direction and the Y direction. The bonding pads 38A, 38B, and 38C may be at different potentials. In the following description, when the bonding pads 38A, 38B, and 38C are not distinguished from one another, the bonding pads 38A, 38B, and 38C are referred to as the "bonding pad 38".

In at least one embodiment, each of the bonding pads 38A, 38B, and 38C includes a plurality of electrode portions 81 separated from one another in at least one of the X direction and the Y direction. In one example which is described here, each of the bonding pads 38A, 38B, and 38C includes a plurality of electrode portions 81 separated from one another in the X direction and the Y direction (see FIG. 4). The first insulator 35 is provided between the plurality of electrode portions 81 in the X direction and the Y direction. In other words, when viewed in the Z direction, the first insulator 35 is provided between the plurality of electrode portions 81 on the bonding surface S. The electrode portion 81 is one example of a "first electrode portion".

The plurality of electrode portions 81 are independently connected to the trace 37. That is, the plurality of electrode portions 81 in the same bonding pad 38 are connected to the same trace 37. The plurality of electrode portions 81 in the same bonding pad 38 are at the same potential. In an example shown in FIG. 3, the plurality of electrode portions 81 in the bonding pad 38A are connected to the trace 37A. The plurality of electrode portions 81 in the bonding pad 38B are connected to the trace 37B. The plurality of electrode portions 81 in the bonding pad 38C are connected to the trace 37C.

Likewise, the trace 47 of the second stacked body 40 includes traces 47A, 47B, and 47C which are electrically independent of one another. The second insulator 45 is provided between the traces 47A, 47B, and 47C in the X direction and the Y direction. This electrically insulates the traces 47A, 47B, and 47C from one another. The traces 47A, 47B, and 47C may be at different potentials. In the following description, when the traces 47A, 47B, and 47C are not distinguished from one another, the traces 47A, 47B, and 47C are referred to as the "trace 47".

The bonding pad 48 of the second stacked body 40 includes a bonding pad 48A connected to the trace 47A, a bonding pad 48B connected to the trace 47B, and a bonding pad 48C connected to the trace 47C. The second insulator 45 is provided between the bonding pads 48A, 48B, and 48C in the X direction and the Y direction. The bonding pads 48A, 48B, and 48C may be at different potentials. In the following description, when the bonding pads 48A, 48B, and 48C are not distinguished from one another, the bonding pads 48A, 48B, and 48C are referred to as the "bonding pad 48".

In at least one embodiment, as in the case of the bonding pads 38A, 38B, and 38C of the first stacked body 30, each of the bonding pads 48A, 48B, and 48C includes a plurality of electrode portions 82 separated from one another in at least one of the X direction and the Y direction. In one example which is described here, each of the bonding pads 48A, 48B, and 48C includes a plurality of electrode portions 82 separated from one another in the X direction and the Y direction. The second insulator 45 is provided between the plurality of electrode portions 82 in the X direction and the Y direction. In other words, when viewed in the Z direction, the second insulator 45 is provided between the plurality of electrode portions 82 on the bonding surface S. The electrode portion 82 is one example of a "second electrode portion".

The plurality of electrode portions 82 are independently connected to the trace 47. That is, the plurality of electrode portions 82 in the same bonding pad 48 are connected to the same trace 47. The plurality of electrode portions 82 in the same bonding pad 48 are at the same potential. In the example shown in FIG. 3, the plurality of electrode portions 82 in the bonding pad 48A are connected to the trace 47A. The plurality of electrode portions 82 in the bonding pad 48B are connected to the trace 47B. The plurality of electrode portions 82 in the bonding pad 48C are connected to the trace 47C.

The plurality of electrode portions 81 of the bonding pad 38 of the first stacked body 30 and the plurality of electrode portions 82 of the bonding pad 48 of the second stacked body 40 are bonded to each other at the bonding surface S, whereby the bonding pad 38 of the first stacked body 30 and the bonding pad 48 of the second stacked body 40 are bonded to each other. In the example shown in FIG. 3, the plurality of electrode portions 81 of the bonding pad 38 of the first stacked body 30 and the plurality of electrode portions 82 of the bonding pad 48 of the second stacked body 40 are provided so as to have the same aspect. The plurality of electrode portions 81 and 82 having "the same aspect" mean the plurality of electrode portions 81 and 82 having the same shape. In this case, the plurality of electrode portions 81 of the bonding pad 38 of the first stacked body 30 and the plurality of electrode portions 82 of the bonding pad 48 of the second stacked body 40 are bonded to each other in a one-to-one relationship.

In the present embodiment, the plurality of electrode portions 81 of the bonding pad 38A of the first stacked body 30 and the plurality of electrode portions 82 of the bonding pad 48A of the second stacked body 40 are bonded to each other, whereby the trace 37A and the trace 47A are electrically connected. Likewise, the plurality of electrode portions 81 of the bonding pad 38B of the first stacked body 30 and the plurality of electrode portions 82 of the bonding pad 48B of the second stacked body 40 are bonded to each other, whereby the trace 37B and the trace 47B are electrically connected. The plurality of electrode portions 81 of the bonding pad 38C of the first stacked body 30 and the plurality of electrode portions 82 of the bonding pad 48C of the second stacked body 40 are bonded to each other, whereby the trace 37C and the trace 47C are electrically connected.

In at least one embodiment, the bonding pads 38A, 38B, 38C, 48A, 48B, and 48C have the same shape. Therefore, in the following description, one bonding pad 38 of the first stacked body 30 will be described in detail. The bonding pad 48 of the second stacked body 40 also has the same structure as the structure which will be described below.

Figure 4:
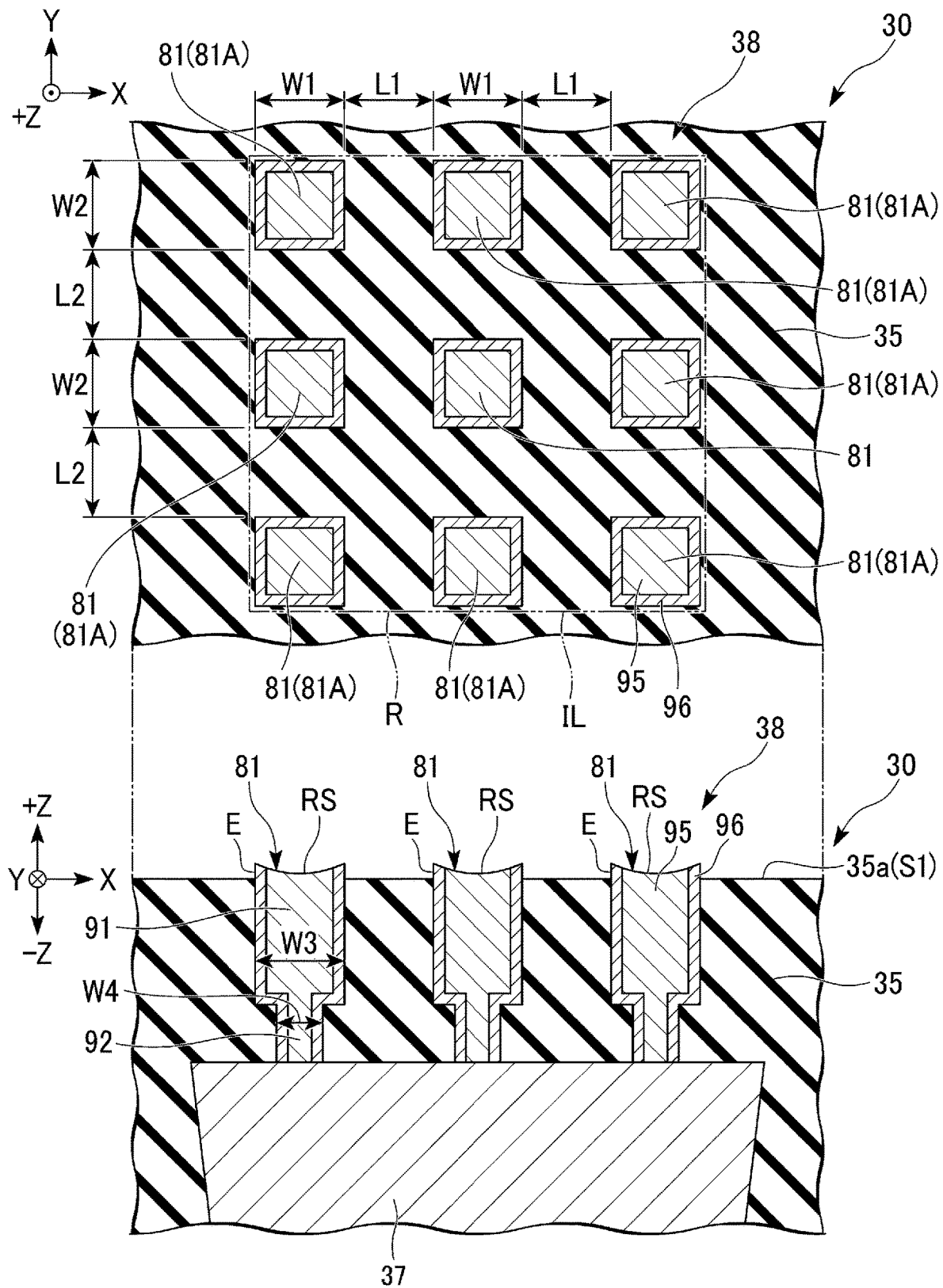
FIG. 4 is a diagram showing the bonding pad of at least one embodiment.

FIG. 4 is a diagram showing the bonding pad 38. FIG. 4 shows the bonding pad 38 in a state in which the first stacked body 30 and the second stacked body 40 are not bonded together. In at least one embodiment, the plurality of electrode portions 81 include nine electrode portions 81 arranged in a 3×3 matrix divided in the X direction and the Y direction, for example. That is, the plurality of electrode portions 81 include a plurality of electrode portions 81 separated from one another in the X direction and arranged at regular intervals. Likewise, the plurality of electrode portions 81 include a plurality of electrode portions 81 separated from one another in the Y direction and arranged at regular intervals. The number and arrangement of electrode portions 81 are not limited to those of the above-mentioned example.

The electrode portion 81 has a quadrangular shape along the X direction and the Y direction, for example. In an example shown in FIG. 4, the width W1 of the electrode portion 81 in the X direction and the distance L1 between two adjacent electrode portions 81 in the X direction are the same. Likewise, the width W2 of the electrode portion 81 in the Y direction and the distance L2 between two adjacent electrode portions 81 in the Y direction are the same. The distances L1 and L2 between two adjacent electrode portion 81 are shorter than the distance L3 (see FIG. 3) between two adjacent bonding pads 38.

When an inner region inside an imaginary line IL integrally surrounding a plurality of electrode portions 81, which are provided in one bonding pad 38, along the edges of a plurality of electrode portions 81A, which are located in the outermost part with respect to the central part of the bonding pad 38, of the plurality of electrode portions 81 when viewed from the Z direction is defined as a "pad region R", the sum of the areas of the plurality of electrode portions 81 in the pad region R is smaller than the area of the first insulator 35 in the pad region R. In other words, the plurality of electrode portions 81 are separated from one another with a relatively large pitch.

In at least one embodiment, each electrode portion 81 includes an electrode main body 91 and a connecting portion 92. The electrode main body 91 is exposed on the bonding surface S (see FIG. 3) and bonded to the bonding pad 48 of the second stacked body 40. The connecting portion 92 is located between the electrode main body 91 and the trace 37 and connects the electrode main body 91 and the trace 37. The connecting portion 92 is thinner than the electrode main body 91. For example, the width W4 of the connecting portion 92 in the X direction is smaller than the width W3 of the electrode main body 91 in the X direction. Likewise, the width of the connecting portion 92 in the Y direction is smaller than the width of the electrode main body 91 in the Y direction. The electrode main body 91 of each electrode portion 81 is connected to the trace 37 via a corresponding connecting portion 92.

From a different viewpoint, each electrode portion 81 includes a conductive portion main body 95 and a barrier metal layer 96. The conductive portion main body 95 forms a main portion of each electrode portion 81. The barrier metal layer 96 is provided between the conductive portion main body 95 and the first insulator 35 in the X direction and the Y direction. The barrier metal layer 96 is a metal layer that prevents a conductive material (for example, copper or aluminum) contained in the conductive portion main body 95 from being dispersed in the first insulator 35. The conductive portion main body 95 and the barrier metal layer 96 are provided in both the electrode main body 91 and the connecting portion 92.

As shown in FIG. 4, an end E of each electrode portion 81 protrudes in the +Z direction from a +Z direction-side front surface 35a of the first insulator 35 in a state in which the first stacked body 30 and the second stacked body 40 are not bonded together. The end E of the electrode portion 81 has a recess portion RS recessed in the −Z direction in the shape of a bowl.

The above description deals with the bonding pad 38 of the first stacked body 30. For the bonding pad 48 of the second stacked body 40, the "bonding pad 38" in the above description only can be read as the "bonding pad 48", the "trace 37" in the above description only can be read as the "trace 47", the "+Z direction" in the above description only has to be read as the "−Z direction", and the "−Z direction" in the above description only has to be read as the "+Z direction".

FIGS. 5A and 5B are sectional views showing the state of the electrode portion 81 of the first stacked body 30 and the electrode portion 82 of the second stacked body 40 when the first stacked body 30 and the second stacked body 40 are bonded together. In at least one embodiment, when the first stacked body 30 and the second stacked body 40 are bonded together, heat is applied to the first stacked body 30 and the second stacked body 40 and the second stacked body 40 is pressed against the first stacked body 30. That is, the second stacked body 40 is pressed against the first stacked body 30 in a state in which the electrode portion 81 of the first stacked body 30 and the electrode portion 82 of the second stacked body 40 are in contact with each other.

This causes the electrode portion 81 of the first stacked body 30 and the electrode portion 82 of the second stacked body 40 to be deformed. That is, the electrode portion 81 of the first stacked body 30 is deformed into a state in which the electrode portion 81 does not protrude from the front surface 35a of the first insulator 35. Furthermore, the recess portion RS at the end E of the electrode portion 81 of the first stacked body 30 is filled and disappears (or gets smaller). Likewise, the electrode portion 82 of the second stacked body 40 is deformed into a state in which the electrode portion 82 does not protrude from a front surface 45a of the second insulator 45. In addition, a recess portion RS at an end E of the electrode portion 82 of the second stacked body 40 is filled and disappears (or gets smaller).

3. Method for Fabricating the Semiconductor Storage Device

Next, a method for fabricating the semiconductor storage device 1 will be described.

FIGS. 6A to 9B are sectional views showing the method for fabricating the semiconductor storage device 1.

FIGS. 6A and 6B show fabrication stages of the circuit chip 2. The circuit chip 2 is fabricated as a part of a circuit wafer CW. The circuit wafer CW includes a plurality of circuit chips 2. The circuit wafer CW is obtained by forming the first stacked body 30 on the first substrate 10. The first stacked body 30 includes the transistor 31, the contact plug 32, the trace 33, the pad 34, and the first insulator 35. They are formed in each layer. The circuit wafer CW is formed by repeating film formation of these layers and processing by photolithography or the like. Publicly known methods may be used as a film formation method and a processing method for elements other than the bonding pad 38. A plurality of bonding pads 38 are exposed on a bonding surface S1 of the circuit wafer CW on the side opposite to the first substrate 10. In this way, the circuit wafer CW is completed.

Hereinafter, a method for forming the bonding pad 38 will be described in detail.

Figure 7A:
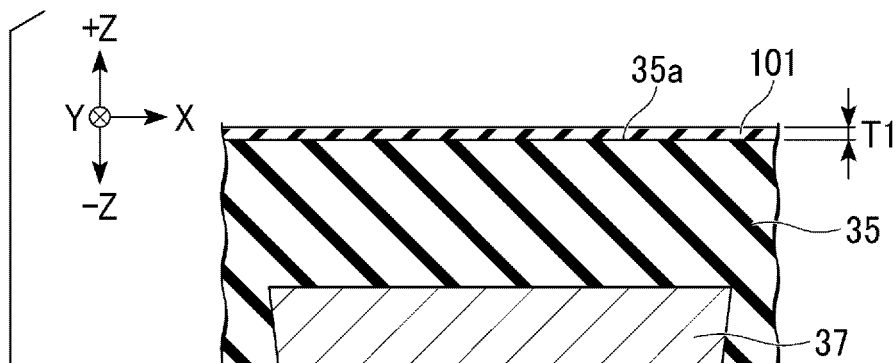
FIGS. 7A to 7D are sectional views showing the method for fabricating the semiconductor storage device of at least one embodiment.

FIGS. 7A to 7D show the details of fabrication stages of the bonding pad 38. First, as shown in FIG. 7A, a part of the first insulator 35 is provided on the trace 37. The first insulator 35 which is provided on the trace 37 is formed of silicon oxide ($SiO_2$), for example.

Next, a protective layer 101 is provided on the first insulator 35. The protective layer 101 is formed of a material different from the material for the first insulator 35. The protective layer 101 is formed of silicon nitride (SiN), for example. The thickness T1 of the protective layer 101 is set so as to be smaller than the depth of recess K (see FIG. 7C)

of the recess portion RS formed by dishing by chemical mechanical polishing, for example. For example, the thickness T1 (for example, the thickness in the Z direction) of the protective layer 101 is larger than the thickness T2 (for example, the thickness in the X direction) of the barrier metal layer 96.

Figure 7B:
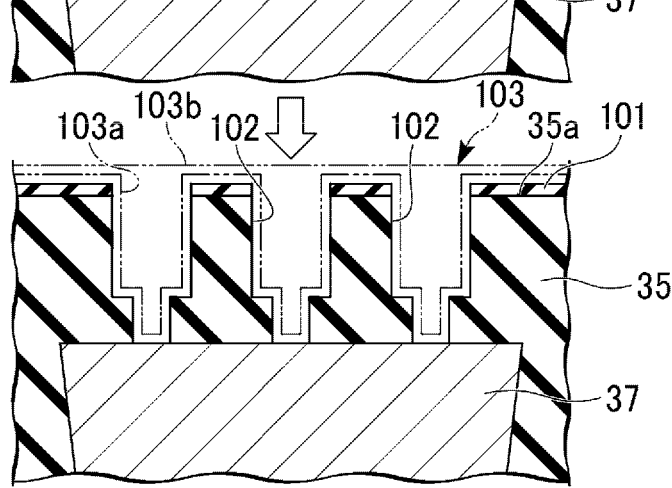

Then, as shown in FIG. 7B, a resist pattern is formed by a photoengraving process (PEP) and the protective layer 101 and the first insulator 35 are etched by reactive ion etching (RIE). By doing so, a plurality of holes 102 are formed in positions where a plurality of electrode portions 81 are provided in a subsequent process.

Next, a conductive layer 103a, which will become the barrier metal layer 96, is formed on the inner surface of each hole 102. Then, a conductive material (for example, a metal material such as copper or aluminum) is embedded in the hole 102, whereby a conductive portion 103b, which will become the conductive portion main body 95, is formed. In this way, a conductive portion 103 with which the hole 102 is filled is formed. The conductive portion 103 is a conductive portion which will become a plurality of electrode portions 81.

Figure 7C:
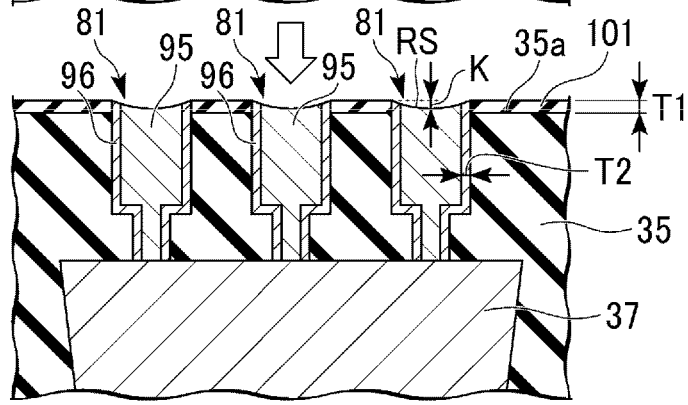

Next, as shown in FIG. 7C, the conductive portion 103 is planarized by chemical mechanical polishing (CMP) using the protective layer 101 as a stop layer. CMP is performed in an end-point mode in which polishing is ended when the front surface of the protective layer 101 is detected, for example. In this way, the plurality of electrode portions 81 are formed from the conductive portion 103. At the same time, the recess portion RS formed by dishing is formed in the front surface of the upper end of each electrode portion 81.

Figure 7D:
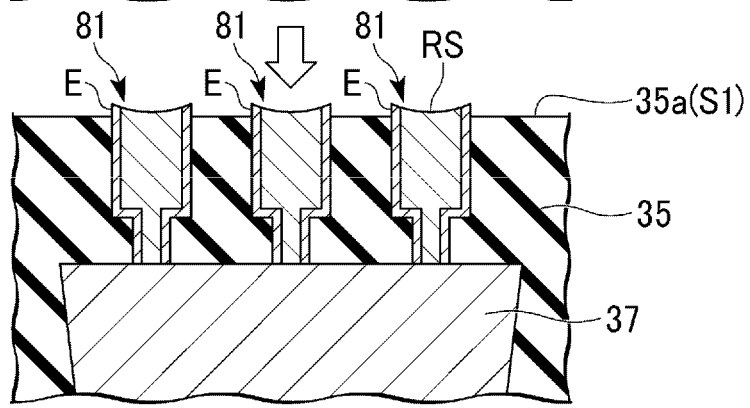

Then, as shown in FIG. 7D, the protective layer 101 is removed. When the protective layer 101 is silicon nitride, the removal of the protective layer 101 is performed using phosphoric acid, for example. As a result, the front surface 35a of the first insulator 35 is exposed. The front surface 35a of the first insulator 35 forms the bonding surface S1 that is bonded to the array chip 3. The end E, which is the upper end of each electrode portion 81, protrudes upward from the front surface 35a (the bonding surface S1) of the first insulator 35. In this way, the bonding pad 38 is completed.

FIGS. 8A and 8B show fabrication stages of the array chip 3. The array chip 3 is fabricated as a part of an array wafer AW. The array wafer AW includes a plurality of array chips 3. The array wafer AW shown in FIG. 8B is in a state in which the array wafer AW is not bonded to the circuit wafer CW, and is turned upside down with respect to the array chip 3 shown in FIG. 1.

The array wafer AW is obtained by forming the second stacked body 40 on the second substrate 60. The second stacked body 40 includes the memory cell array 41, the contact plug 42, the trace 43, the pad 44, and the second insulator 45. They are formed in each layer. The array wafer AW is formed by repeating film formation of these layers and processing by photolithography or the like. Publicly known methods may be used as a film formation method and a processing method for elements other than the bonding pad 48. A plurality of bonding pads 48 are exposed on a bonding surface S2 of the array wafer AW on the side opposite to the second substrate 60. A method for forming the bonding pad 48 is the same as the method for forming the bonding pad 38, which was described with reference to FIGS. 7A to 7D, for example. In this way, the array wafer AW is completed.

Figure 9A:
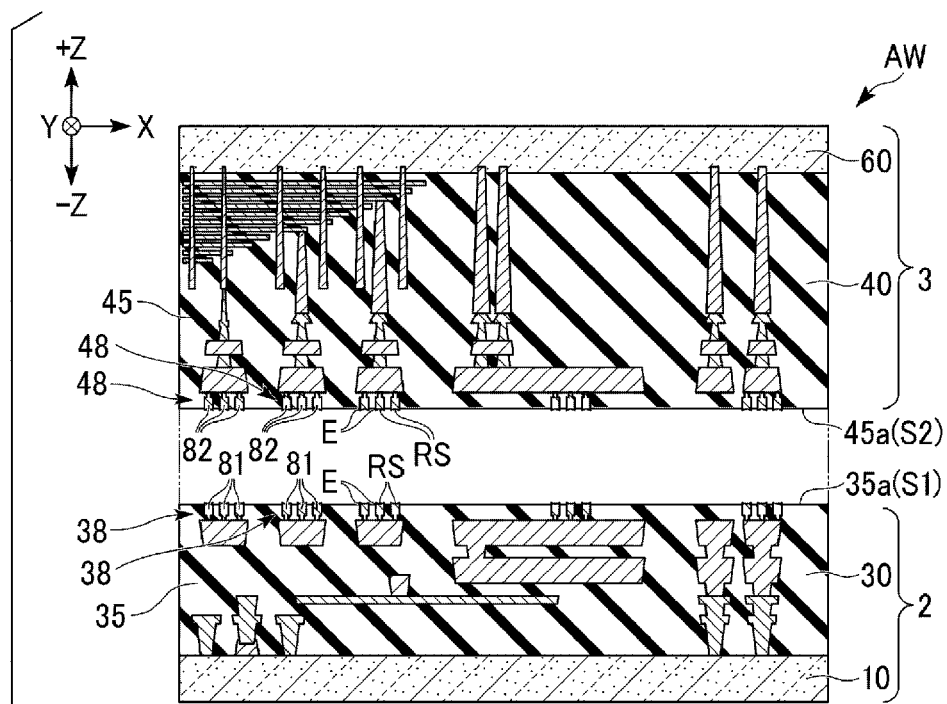
FIGS. 9A and 9B are sectional views showing the method for fabricating the semiconductor storage device of at least one embodiment.
Figure 9B:
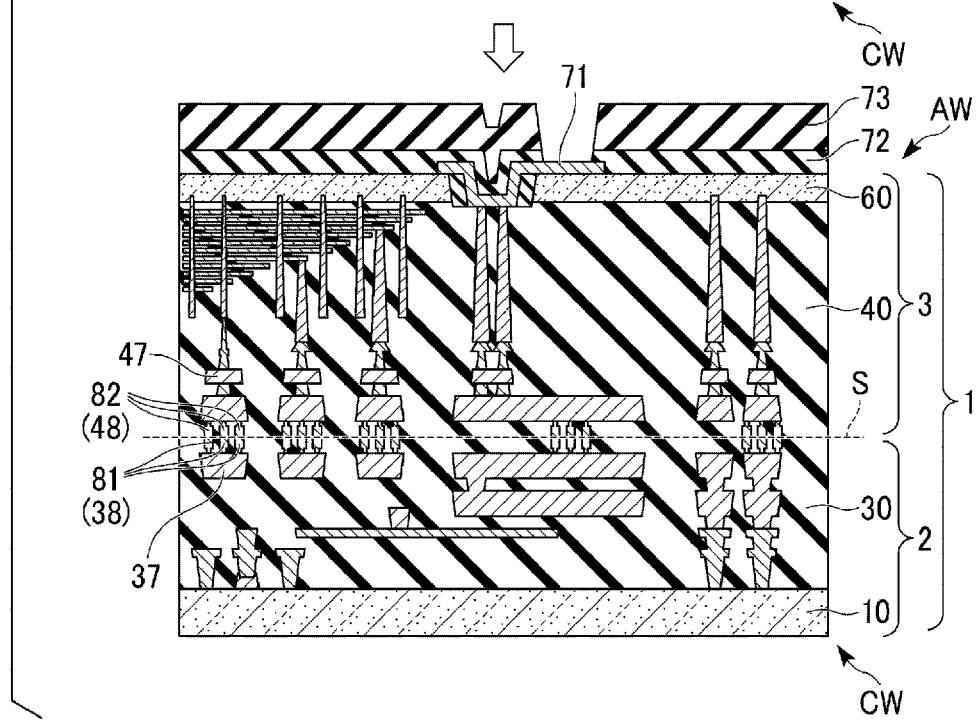

FIGS. 9A and 9B show bonding stages in which the circuit wafer CW and the array wafer AW are bonded together. Specifically, the circuit wafer CW and the array wafer AW are bonded together by the application of heat to the circuit wafer CW and the array wafer AW and by mechanical pressure with the bonding surface S1 of the circuit wafer CW and the bonding surface S2 of the array wafer AW facing each other (that is, the bonding pad 38 of the first stacked body 30 and the bonding pad 48 of the second stacked body 40 facing each other). In this way, the first insulator 35 and the second insulator 45 are bonded.

At the same time, as described with reference to FIGS. 5A and 5B, the bonding pad 38 of the circuit wafer CW and the bonding pad 48 of the array wafer AW come into contact with each other in a state in which the end E of each electrode portion 81 of the bonding pad 38 protrudes from the front surface 35a of the first insulator 35 and the end E of each electrode portion 82 of the bonding pad 48 protrudes from the front surface 45a of the second insulator 45. Then, the electrode portion 81 of the bonding pad 38 and the electrode portion 82 of the bonding pad 48, which are in contact with each other, are deformed by mechanical pressure, and the recess portions RS, which were formed in the electrode portions 81 and 82 by dishing in the previous process, are filled and disappear (or get smaller).

Next, the array wafer AW and the circuit wafer CW are annealed at 400° C. As a result, the electrode portions 81 of the bonding pad 38 and the electrode portions 82 of the bonding pad 48 are bonded. In this way, a bonded body 111 configured with the circuit wafer CW and the array wafer AW which are bonded together is formed.

Then, the second substrate 60 is made thinner. The second substrate 60 is made thinner by CMP, for example. Next, the external connection pad 71 and the insulating layers 72 and 73 are provided on the second substrate 60 by a publicly known method. Then, the bonded body 111 is cut along unillustrated dicing lines. As a result, the bonded body 111 is divided into a plurality of chips (i.e., semiconductor storage devices 1). In this way, the semiconductor storage device 1 is obtained.

4. Advantages

A case where a bonding pad is configured with one relatively large electrode portion will be discussed for comparison. In a configuration of this comparative example, when large dishing occurs at an end of a bonding pad due to CMP or for other reasons, space is sometimes left between two bonding pads which are bonded together. In this case, voids are formed in a bonded surface between the two bonding pads. This increases the electrical resistance of the bonding pads.

Furthermore, the voids sometimes move to (clump together in) a connecting portion between the bonding pad and the trace by stress migration caused by ambient temperature. In this case, there is a possibility that a break occurs between the bonding pad and the trace. On the other hand, when an annealing temperature is increased so as to increase thermal expansion to bond the two bonding pads more reliably, the metal contained in the barrier metal layer diffuses in the insulator, which may result in a decrease in barrier performance achieved by the barrier metal layer.

On the other hand, in the present embodiment, the bonding pad 38 includes a plurality of electrode portions 81 separated from one another in the X direction and connected to the trace 37. The first insulator 35 is provided between the plurality of electrode portions 81. In this configuration, since the bonding pad 38 is divided into a plurality of small electrode portions 81, large dishing is less likely to occur in each electrode portion 81, which makes smaller the depth of recess K of the recess portion RS. Thus, space is less likely to be left between two bonding pads 38 and 48 which are bonded together and voids are less likely to occur in a bonded surface between the two bonding pads 38 and 48. As a result, the electrical resistance of the bonding pads 38 and 48 is less likely to increase. This makes it possible to improve the electrical characteristics of the semiconductor storage device 1.

Moreover, in the present embodiment, the plurality of electrode portions 81 are independently connected to the trace 37. This configuration makes it possible to distribute the stress, which is applied to the bonding pad 38, among the plurality of electrode portions 81. This makes it possible to reduce the probability of a break caused by stress migration.

In at least one embodiment, at the time of fabrication of the semiconductor storage device 1, the protective layer 101 is provided on the first insulator 35. Then, by performing chemical mechanical polishing using the protective layer 101 as a stop layer, a plurality of electrode portions 81 are formed. The protective layer 101 is then removed. As a result, the ends E of the plurality of electrode portions 81 protrude from the first insulator 35. Then, the plurality of electrode portions 81 of the bonding pad 38 are brought into contact with the bonding pad 48 in a state in which the ends E of the plurality of electrode portions 81 protrude from the first insulator 35. In this configuration, since the two bonding pads 38 and 48 are bonded in a state in which the end E of each electrode portion 81 protrudes from the first insulator 35, the recess portion RS formed by dishing is filled with the end E of the electrode portion 81 protruding from the first insulator 35. This makes space less likely to be left between the two bonding pads 38 and 48 which are bonded together and makes voids less likely to occur in the bonded surface between the two bonding pads 38 and 48. This makes it possible to improve the electrical characteristics of the semiconductor storage device 1.

Furthermore, when chemical mechanical polishing is performed using the protective layer 101 as a stop layer, as compared with a case where the protective layer 101 is not provided, the recess portion RS formed by dishing is formed in a higher position with respect to the front surface 35a of the first insulator 35. That is, a plurality of electrode portions 81 are formed with an interface at which dishing is formed being raised. Thus, large dishing is less likely to occur in the electrode portion 81 with reference to the front surface 35a of the first insulator 35, which makes smaller the depth of recess K of the recess portion RS. This also makes space less likely to be left between the two bonding pads 38 and 48 which are bonded together and makes voids less likely to occur in the bonded surface between the two bonding pads 38 and 48. This makes it possible to improve the electrical characteristics of the semiconductor storage device 1.

In at least one embodiment, when a region integrally surrounding a plurality of electrode portions 81 along the edges of a plurality of electrode portions 81A, which are located in the outermost part with respect to the central part of the bonding pad 38, of the plurality of electrode portions 81 when viewed from the Z direction is defined as a pad region R, the sum of the areas of the plurality of electrode portions 81 in the pad region R is smaller than the area of the first insulator 35 in the pad region R. In this configuration, since the bonding pad 38 is divided into a plurality of smaller electrode portions 81, large dishing is further less likely to occur in each electrode portion 81. This makes it possible to improve the electrical characteristics of the semiconductor storage device 1.

In at least one embodiment, a plurality of electrode portions 81 include a plurality of electrode portions 81 separated from one another in the X direction and a plurality of electrode portions 81 separated from one another in the Y direction. In this configuration, since the bonding pad 38 is divided into a plurality of small electrode portions 81 in a plurality of directions, large dishing is further less likely to occur in each electrode portion 81. This makes it possible to improve the electrical characteristics of the semiconductor storage device 1.

In at least one embodiment, each of the plurality of electrode portions 81 includes the electrode main body 91 and the connecting portion 92 located between the electrode main body 91 and the trace 37. The width W4 of the connecting portion 92 in the X direction is smaller than the width W3 of the electrode main body 91 in the X direction. In this configuration, even when this is a configuration in which a break tends to occur by stress migration due to the narrowed connecting portion 92, since the plurality of electrode portions 81 are independently connected to the trace 37, it is possible to reduce the probability of a break caused by stress migration.

5. Modification

Hereinafter, a modification will be described. In this modification, a configuration other than that described below is the same as the configuration of the embodiment described above.

Figure 10:
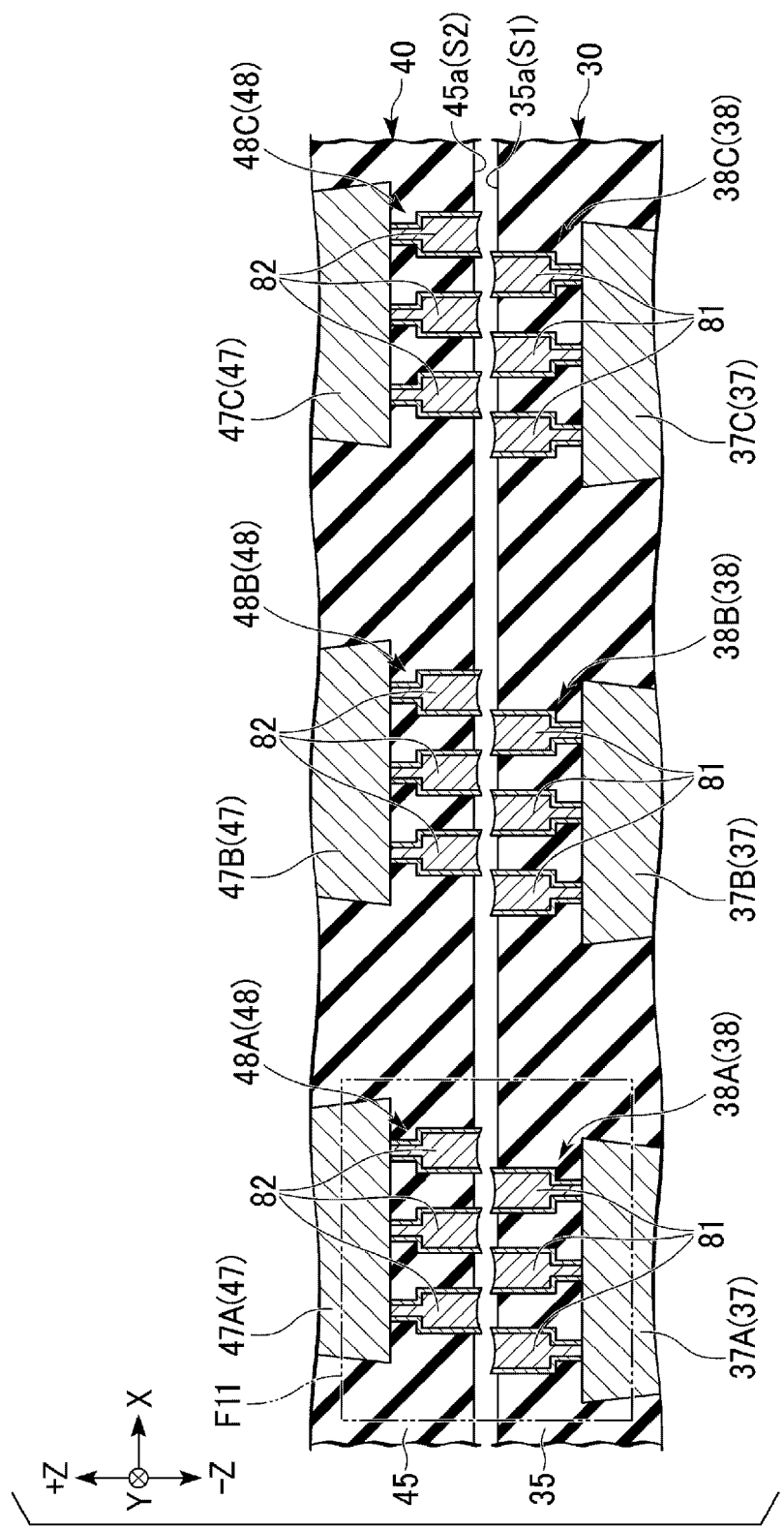
FIG. 10 is a sectional view showing a semiconductor storage device of a modification of at least one embodiment.
Figure 11:
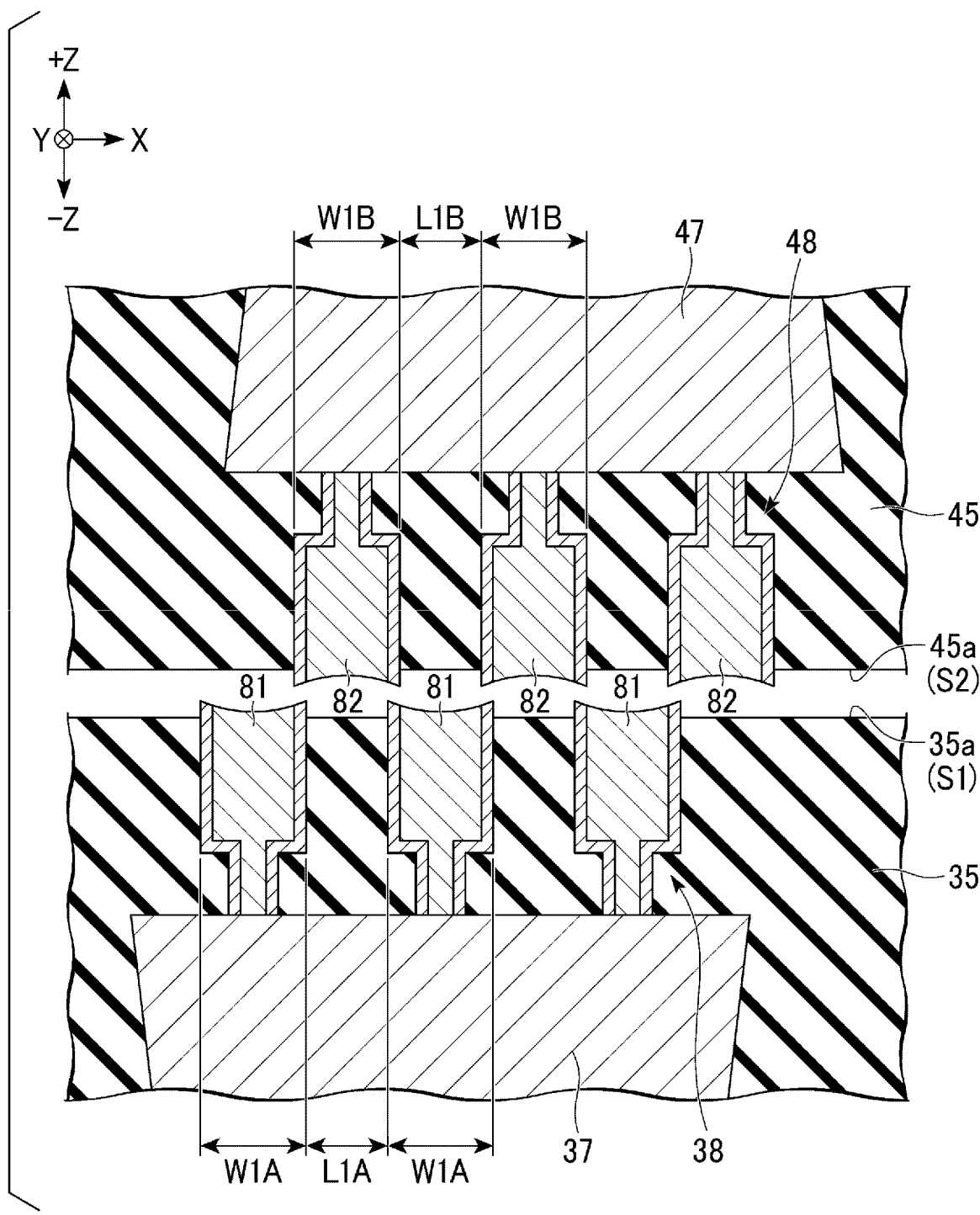
FIG. 11 is a sectional view showing an enlarged region, which is surrounded with a line F11 shown in FIG. 10.

FIG. 10 is a sectional view showing a semiconductor storage device 1 of the modification. FIG. 11 is a sectional view showing an enlarged region, which is surrounded with a line F11 shown in FIG. 10. In this modification, the width W1A of each electrode portion 81 of a bonding pad 38 of a first stacked body 30 in the X direction is larger than the distance L1B between two adjacent electrode portions 82 of a bonding pad 48 of a second stacked body 40 in the X direction. Likewise, the width W1B of each electrode portion 82 of the bonding pad 48 of the second stacked body 40 in the X direction is larger than the distance L1A between two adjacent electrode portions 81 of the bonding pad 38 of the first stacked body 30 in the X direction. The same goes for the Y direction.

In this modification, even when the bonding pad 48 of the second stacked body 40 is displaced with respect to the bonding pad 38 of the first stacked body 30, a part of the electrode portion 81 of the bonding pad 38 and a part of the electrode portion 82 of the bonding pad 48 reliably face each other in the Z direction and the electrode portion 81 of the bonding pad 38 and the electrode portion 82 of the bonding pad 48 are reliably connected. This makes it possible to improve the electrical characteristics of the semiconductor storage device 1.

6. Examples

Hereinafter, some examples related to the shapes of the electrode portions 81 and 82 of the bonding pads 38 and 48 will be described. In the following description, the shape of the electrode portion 81 of the bonding pad 38 of the first stacked body 30 will be described as a typical example. The same goes for the shape of the electrode portion 82 of the bonding pad 48 of the second stacked body 40. The shapes of the electrode portions 81 and 82 are not limited to those of the examples which will be described below.

6.1 First Example

Figure 12:
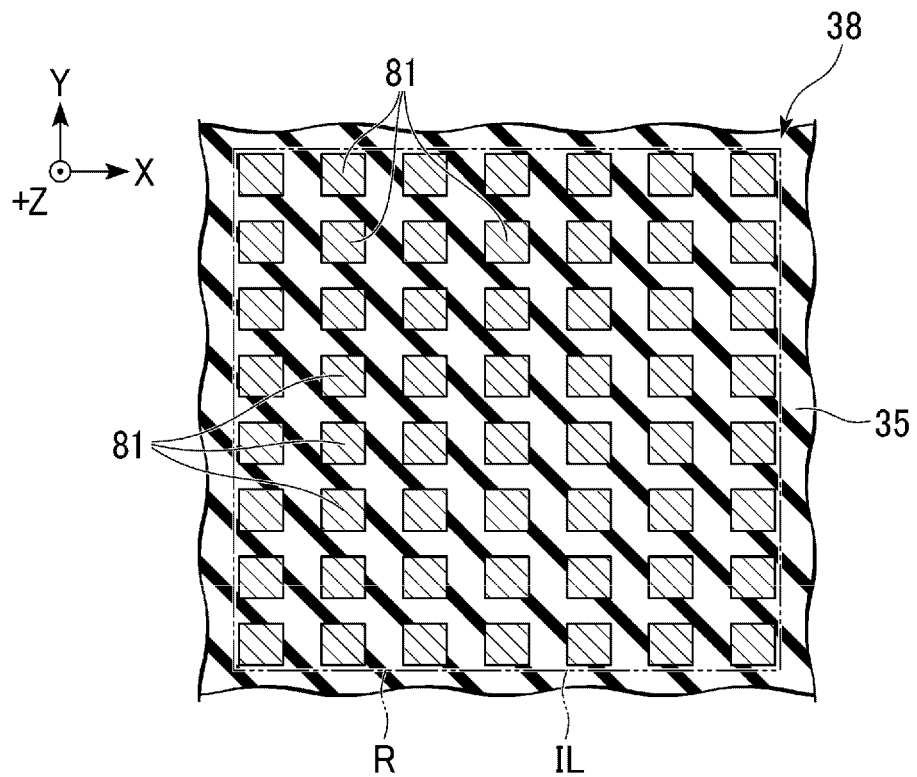
FIG. 12 is a sectional view showing the shape of each of a plurality of electrode portions of a first example of at least one embodiment.

FIG. 12 is a sectional view showing the shape of each of a plurality of electrode portions 81 of a first example. In the first example, the plurality of electrode portions 81 are arranged in a matrix in which the electrode portions 81 are separated from one another in the X direction and the Y direction. In an example shown in FIG. 12, 8×7, that is, 56 electrode portions 81 are provided.

6.2 Second Example

Figure 13:
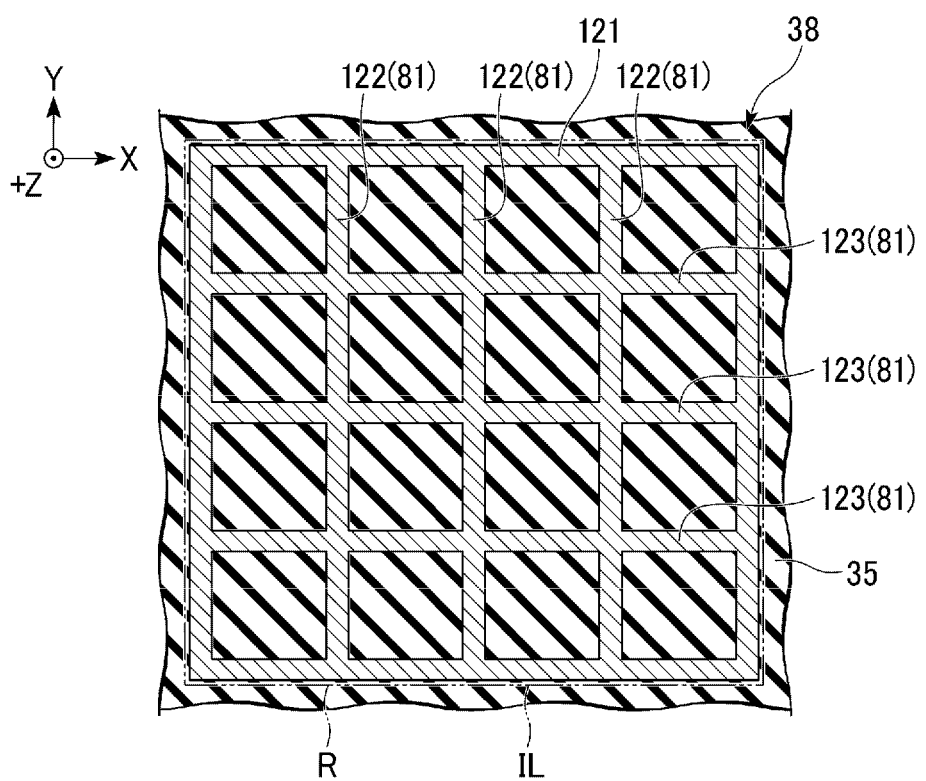
FIG. 13 is a sectional view showing the shape of each of a plurality of electrode portions of a second example of at least one embodiment.

FIG. 13 is a sectional view showing the shape of each of a plurality of electrode portions 81 of a second example. In the second example, the bonding pad 38 includes a frame portion 121, a plurality of first straight-line portions 122, and a plurality of second straight-line portions 123. The plurality of first straight-line portions 122 and the plurality of second straight-line portions 123 are provided inside the frame portion 121. The plurality of first straight-line portions 122 are separated from one another in the X direction and extend in the Y direction. The first insulator 35 is provided between the plurality of first straight-line portions 122 in the X direction. On the other hand, the plurality of second straight-line portions 123 are separated from one another in the Y direction and extend in the X direction. The first insulator 35 is provided between the plurality of second straight-line portions 123 in the Y direction. The plurality of first straight-line portions 122 and the plurality of second straight-line portions 123 intersect.

In this example, the plurality of first straight-line portions 122 form a plurality of electrode portions 81 separated from one another in the X direction. Likewise, the plurality of second straight-line portions 123 form a plurality of electrode portions 81 separated from one another in the Y direction. In the present specification, a case where portions are "separated from one another" is not limited to a case where the portions are completely independent of one another as in the first example, and also includes a case where the portions are connected to one another via a different portion (for example, the frame portion 121).

In the second example, each first straight-line portion 122 has a length that allows the first straight-line portion 122 to be across (extend across) at least two or more second straight-line portions 123 of the plurality of second straight-line portions 123 in a direction (the Y direction) in which the first straight-line portion 122 extends. In this configuration, even when Y-direction displacement occurs between the bonding pad 38 and the bonding pad 48, the bonding pad 38 and the bonding pad 48 can be connected more reliably. Likewise, each second straight-line portion 123 has a length that allows the second straight-line portion 123 to be across (extend across) at least two or more first straight-line portions 122 of the plurality of first straight-line portions 122 in a direction (the X direction) in which the second straight-line portion 123 extends. In this configuration, even when X-direction displacement occurs between the bonding pad 38 and the bonding pad 48, the bonding pad 38 and the bonding pad 48 can be connected more reliably.

6.3 Third Example

Figure 14:
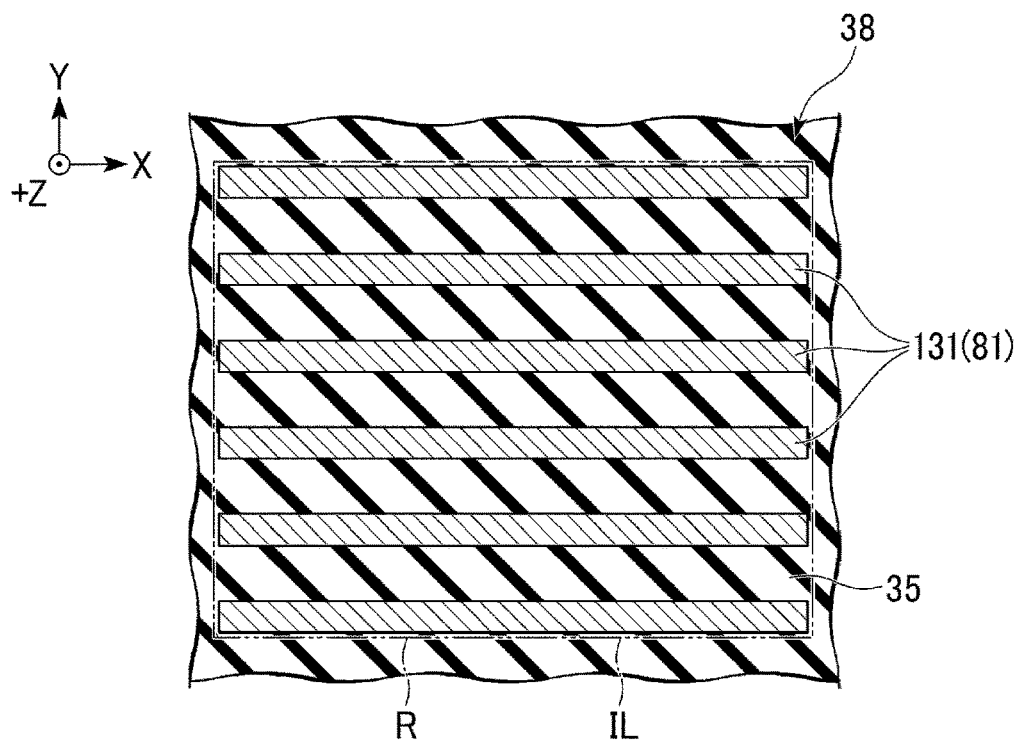
FIG. 14 is a sectional view showing the shape of each of a plurality of electrode portions of a third example of at least one embodiment.

FIG. 14 is a sectional view showing the shape of each of a plurality of electrode portions 81 of a third example. In the third example, the bonding pad 38 includes a plurality of straight-line portions 131. The plurality of straight-line portions 131 are separated from one another in the Y direction and extend in the X direction. The first insulator 35 is provided between the plurality of straight-line portions 131 in the Y direction. In this example, the plurality of straight-line portions 131 form a plurality of electrode portions 81 separated from one another in the Y direction. In this configuration, even when X-direction displacement occurs between the bonding pad 38 and the bonding pad 48, the bonding pad 38 and the bonding pad 48 are easily connected more reliably.

6.4 Fourth Example

Figure 15:
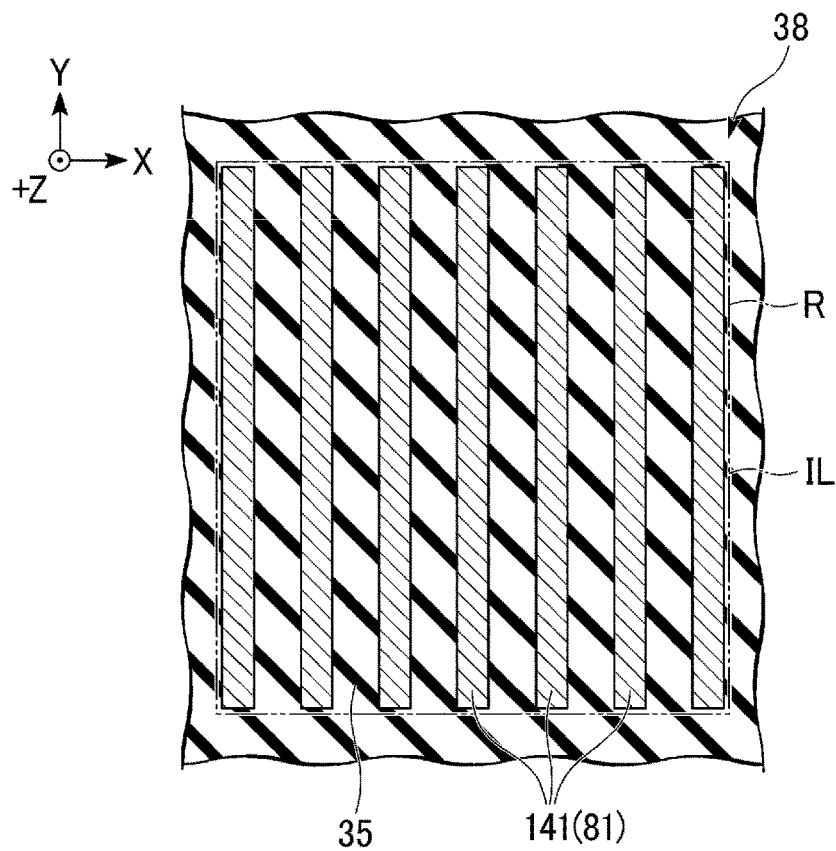
FIG. 15 is a sectional view showing the shape of each of a plurality of electrode portions of a fourth example of at least one embodiment.

FIG. 15 is a sectional view showing the shape of each of a plurality of electrode portions 81 of a fourth example. In the fourth example, the bonding pad 38 includes a plurality of straight-line portions 141. The plurality of straight-line portions 141 are separated from one another in the X direction and extend in the Y direction. The first insulator 35 is provided between the plurality of straight-line portions 141 in the X direction. In this example, the plurality of straight-line portions 141 form a plurality of electrode portions 81 separated from one another in the X direction. In this configuration, even when Y-direction displacement occurs between the bonding pad 38 and the bonding pad 48, the bonding pad 38 and the bonding pad 48 are easily connected more reliably.

6.5 Fifth Example

Figure 16:
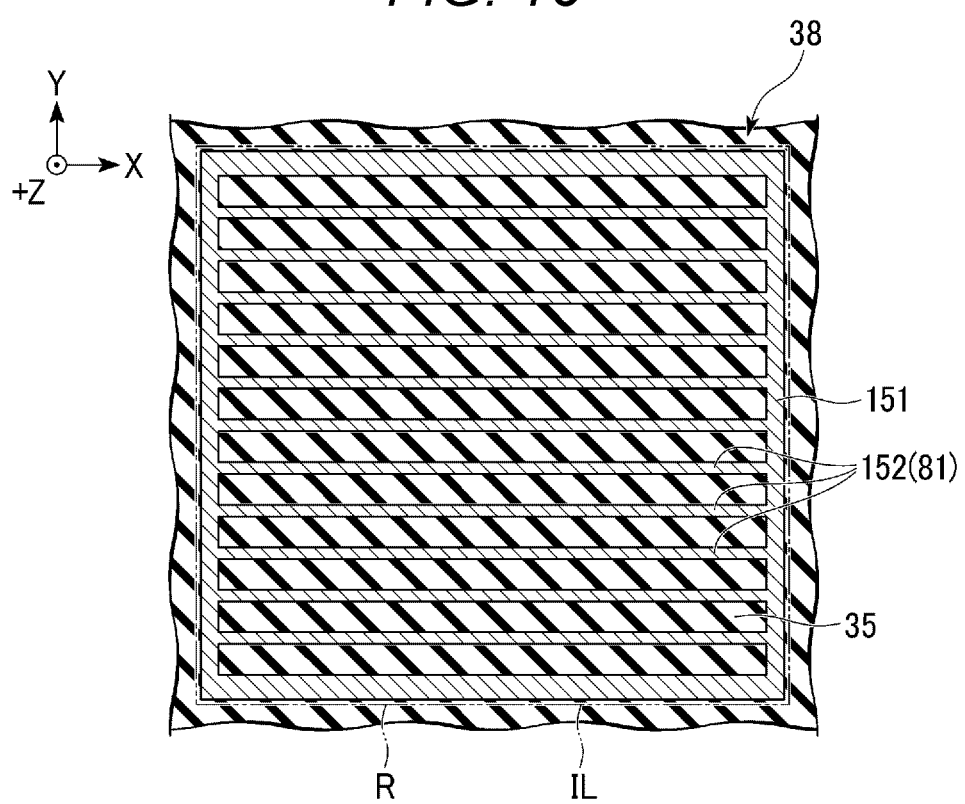
FIG. 16 is a sectional view showing the shape of each of a plurality of electrode portions of a fifth example of at least one embodiment.

FIG. 16 is a sectional view showing the shape of each of a plurality of electrode portions 81 of a fifth example. In the fifth example, the bonding pad 38 includes a frame portion 151 and a plurality of straight-line portions 152. The plurality of straight-line portions 152 are provided inside the frame portion 151. The plurality of straight-line portions 152 are separated from one another in the Y direction and extend in the X direction. The first insulator 35 is provided between the plurality of straight-line portions 152 in the Y direction. In this example, the plurality of straight-line portions 152 form a plurality of electrode portions 81 separated from one another in the Y direction.

6.6 Sixth Example

Figure 17:
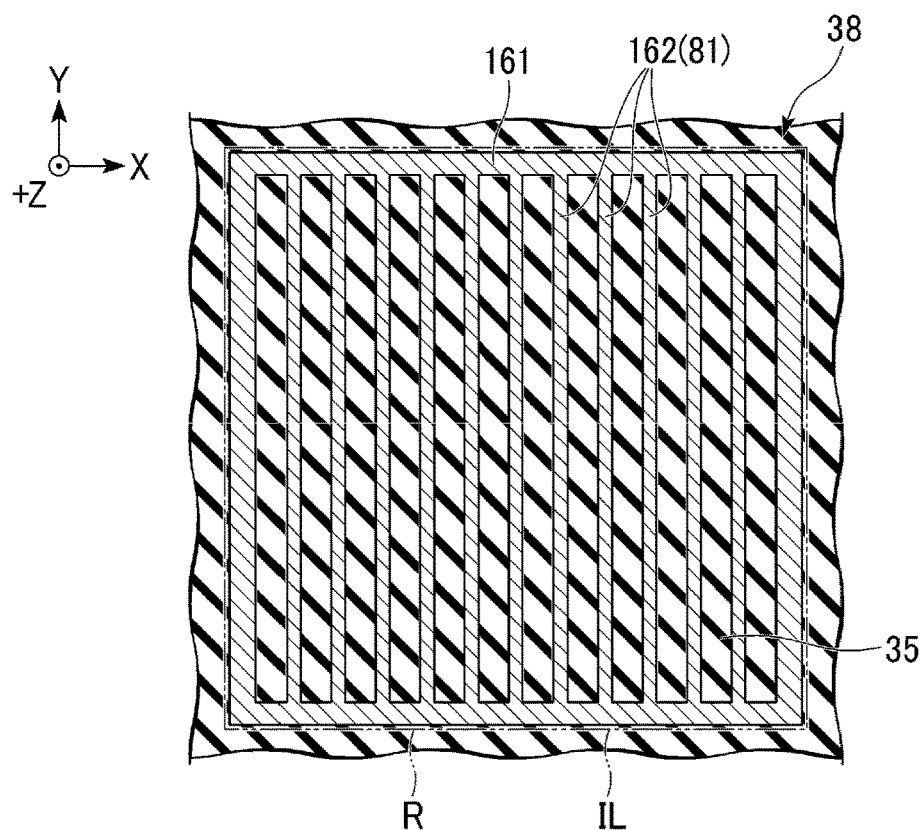
FIG. 17 is a sectional view showing the shape of each of a plurality of electrode portions of a sixth example of at least one embodiment.

FIG. 17 is a sectional view showing the shape of each of a plurality of electrode portions 81 of a sixth example. In the sixth example, the bonding pad 38 includes a frame portion 161 and a plurality of straight-line portions 162. The plurality of straight-line portions 162 are provided inside the frame portion 161. The plurality of straight-line portions 162 are separated from one another in the X direction and extend in the Y direction. The first insulator 35 is provided between the plurality of straight-line portions 162 in the X direction. In this example, the plurality of straight-line portions 162 form a plurality of electrode portions 81 separated from one another in the X direction.

6.7 Seventh Example

Figure 18:
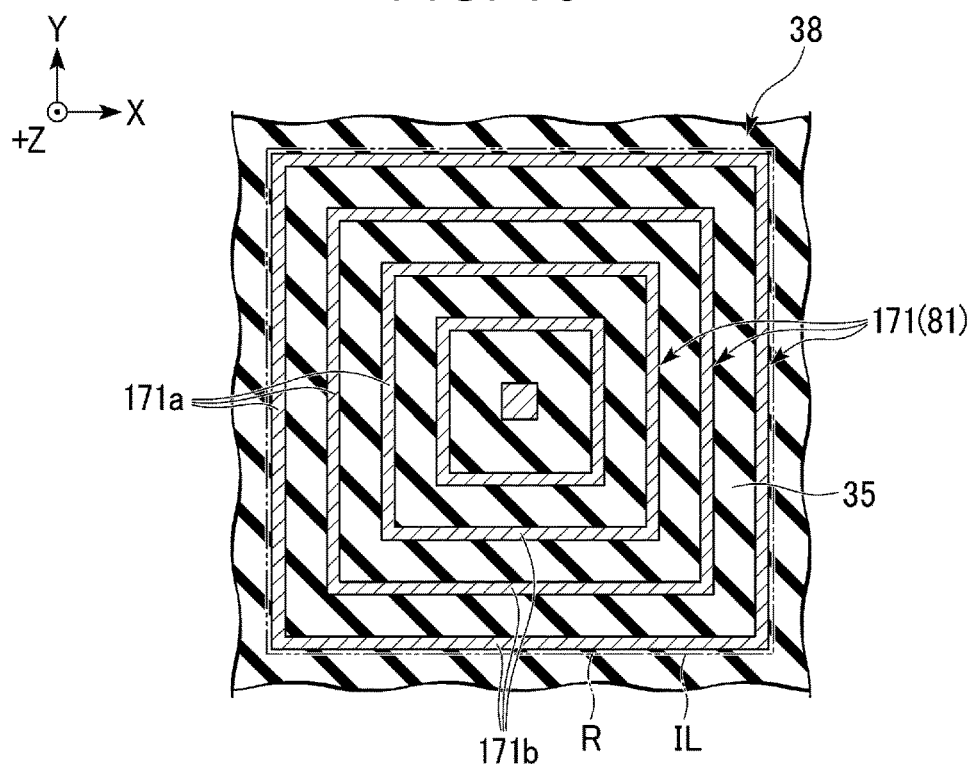
FIG. 18 is a sectional view showing the shape of each of a plurality of electrode portions of a seventh example of at least one embodiment.

FIG. 18 is a sectional view showing the shape of each of a plurality of electrode portions 81 of a seventh example. In the seventh example, the bonding pad 38 includes a plurality of frame portions 171. The plurality of frame portions 171 have similar annular shapes having different sizes and are concentrically arranged. The first insulator 35 is provided between the plurality of frame portions 171 in the X direction and the Y direction. In this example, the plurality of frame portions 171 form a plurality of annular electrode portions 81. From a different viewpoint, linear portions 171a along the Y direction, which are provided in the plurality of frame portions 171, form a plurality of electrode portions 81 separated from one another in the X direction. Likewise, linear portions 171b along the X direction, which are provided in the plurality of frame portions 171, form a plurality of electrode portions 81 separated from one another in the Y direction. When the bonding pad 38 includes both a portion extending in the Y direction and a portion extending in the X direction, even when displacement occurs between the bonding pad 38 and the bonding pad 48 in any of the X direction and the Y direction, the bonding pad 38 and the bonding pad 48 are easily connected more reliably.

6.8 Eighth Example

FIGS. 19A to 19C are sectional views showing the shape of each of a plurality of electrode portions 81 and 82 of an eighth example. FIG. 19A shows the plurality of electrode portions 81 of the bonding pad 38 of the first stacked body 30. FIG. 19B shows the plurality of electrode portions 82 of the bonding pad 48 of the second stacked body 40.

In this example, the plurality of electrode portions 81 of the bonding pad 38 of the first stacked body 30 are provided so as to have a first aspect. The first aspect of this example is the same as the aspect of the third example (FIG. 14), for example. On the other hand, the plurality of electrode portions 82 of the bonding pad 48 of the second stacked body 40 are provided so as to have a second aspect different from the above-mentioned first aspect. The electrode portion 81 and the electrode portion 82 having "different aspects" mean the electrode portion 81 and the electrode portion 82 having different shapes. The second aspect of this example is the same as the aspect of the fourth example (FIG. 15), for example.

FIG. 19C shows a state in which the plurality of electrode portions 81 of the bonding pad 38 and the plurality of electrode portions 82 of the bonding pad 48 are stacked (bonded together). In an example shown in FIGS. 19A to 19C, a direction (the Y direction) in which the plurality of electrode portions 81 of the bonding pad 38 are separated from one another is different from a direction (the X direction) in which the plurality of electrode portions 82 of the bonding pad 48 are separated from one another.

At least part of each electrode portion 81 of the bonding pad 38 linearly extends so as to be across (extend across) two or more electrode portions 82 in the direction (the X direction) in which the plurality of electrode portions 82 of the bonding pad 48 are separated from one another. On the other hand, at least part of each electrode portion 82 of the bonding pad 48 linearly extends so as to be across (extend across) two or more electrode portions 81 in the direction (the Y direction) in which the plurality of electrode portions 81 of the bonding pad 38 are separated from one another. In this configuration, even when displacement occurs between the bonding pad 38 and the bonding pad 48 in any of the X direction and the Y direction, the bonding pad 38 and the bonding pad 48 are connected more reliably.

6.9 Ninth Example

FIGS. 20A to 20C are sectional views showing a plurality of electrode portions 81 and 82 of a ninth example. FIG. 20A shows the plurality of electrode portions 81 of the bonding pad 38 of the first stacked body 30. FIG. 20B shows the plurality of electrode portions 82 of the bonding pad 48 of the second stacked body 40.

In this example, the plurality of electrode portions 81 of the bonding pad 38 of the first stacked body 30 are provided so as to have a first aspect. The first aspect of this example is the same as the aspect of the first example (FIG. 12), for example. On the other hand, the plurality of electrode portions 82 of the bonding pad 48 of the second stacked body 40 are provided so as to have a second aspect different from the above-mentioned first aspect. The second aspect of this example is the same as the aspect of the seventh example (FIG. 18), for example.

FIG. 20C shows a state in which the plurality of electrode portions 81 of the bonding pad 38 and the plurality of electrode portions 82 of the bonding pad 48 are stacked (bonded together). In an example shown in FIGS. 20A to 20C, the plurality of electrode portions 81 of the bonding pad 38 are separated from one another in the X direction and the Y direction. On the other hand, at least part (for example, a linear portion 171b) of each electrode portion 82 of the bonding pad 48 linearly extends so as to be across (extend across) two or more electrode portions 81 in the direction (the X direction) in which the plurality of electrode portions 81 of the bonding pad 38 are separated from one another. At least part (for example, a linear portion 171a) of each electrode portion 82 of the bonding pad 48 linearly extends so as to be across (extend across) two or more electrode portions 81 in the direction (the Y direction) in which the plurality of electrode portions 81 of the bonding pad 38 are separated from one another. In this configuration, even when displacement occurs between the bonding pad 38 and the bonding pad 48 in any of the X direction and the Y direction, the bonding pad 38 and the bonding pad 48 can be connected more reliably.

The above description deals with at least one embodiment, the modification, and some examples; the embodiment, the modification, and the examples are not limited to those described above. For example, the electrode portion 81 of the bonding pad 38 of one freely selected example of the above-mentioned first to seventh examples and the electrode portion 82 of the bonding pad 48 of another freely selected example of the above-mentioned first to seventh examples may be bonded. In all the explanations described above, the bonding pad 38 may have the shape of the bonding pad 48 and the bonding pad 48 may have the shape of the bonding pad 38. In at least one embodiment described above, the bonding pad 38 is divided into a plurality of electrode portions 81 and the bonding pad 48 is divided into a plurality of electrode portions 82; the bonding pad 38 may be divided into a plurality of electrode portions 81 and the bonding pad 48 may be provided as one large pad or the bonding pad 48 may be divided into a plurality of electrode portions 82 and the bonding pad 38 may be provided as one large pad.

According to at least one embodiment described above, a semiconductor storage device includes a first stacked body and a second stacked body. The first stacked body includes a first trace, a first pad connected to the first trace, and a first insulator. The second stacked body includes a second trace, a second pad connected to the second trace, and a second insulator. The first pad includes a plurality of first electrode portions separated from one another and connected to the first trace. The first insulator is provided between the plurality of first electrode portions. The plurality of first electrode portions are connected to the second pad. This configuration makes it possible to provide a semiconductor storage device and a method for fabricating the semiconductor storage device, the device and the method that can improve electrical characteristics.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
a first substrate;
a second substrate separated from the first substrate in a first direction;
a first stacked body disposed between the first substrate and the second substrate, and including a first trace, a first pad connected to the first trace, and a first insulator; and
a second stacked body disposed between the first stacked body and the second substrate, and including a second trace, a second pad connected to the second trace, and a second insulator,
wherein the first pad includes a plurality of first electrode portions separated from one another in a second direction intersecting the first direction, the plurality of first electrode portions being connected to the first trace,
wherein the first insulator is disposed between the plurality of first electrode portions,
wherein the plurality of first electrode portions are bonded to the second pad,
wherein the second pad includes a plurality of second electrode portions separated from one another in the second direction or in a third direction intersecting the first direction and the second direction, the second electrode portions being connected to the second trace,
wherein the second insulator is disposed between the plurality of second electrode portions, and
wherein the plurality of second electrode portions are bonded to the plurality of first electrode portions directly.

2. The device according to claim 1,
wherein a pad region integrally surrounds the plurality of first electrode portions along edges of a plurality of electrode portions of the plurality of first electrode portions when viewed from the first direction, the edges located in an outermost part with respect to a central part of the first pad, a sum of areas of the plurality of first electrode portions in the pad region being smaller than an area of the first insulator in the pad region.

3. The device according to claim 1,
wherein each of the plurality of first electrode portions includes: an electrode main body bonded to the second pad; and a connecting portion located between the electrode main body and the first trace, the connecting portion connects the electrode main body and the first trace, and has a smaller width than the electrode main body in the second direction.

4. The device according to claim 1,
wherein the plurality of first electrode portions include: (i) a plurality of electrode portions separated from one another in the second direction; and (ii) another plurality of electrode portions separated from one another in a third direction, the third direction being different from the first direction and the second direction.

5. The device according to claim 1,
wherein the plurality of first electrode portions include a plurality of electrode portions separated from one another in the second direction, and
wherein each of the plurality of electrode portions linearly extends in a third direction different from the first direction and the second direction.

6. The device according to claim 1,
wherein at least two of the plurality of first electrode portions have concentric annular shapes.

7. The device according to claim 1,
wherein at least two of the plurality of first electrode portions are separated from one another so as to have a first aspect, and
wherein at least two other of the plurality of second electrode portions are separated from one another so as to have a second aspect different from the first aspect.

8. The device according to claim 1, wherein the first substrate is formed of a semiconductor material.

9. The device according to claim 1, wherein the device is a three dimensional memory.

10. The device according to claim 9, wherein the three dimensional memory includes a circuit chip and a memory array chip.

11. The device according to claim 1, further comprising a memory cell array electrically connected to the second trace and the second pad.

12. The device according to claim 1, wherein the first electrode portions are arranged in a two dimensional array.

13. The device according to claim 1, wherein the first electrode portions have a quadrangular shape in a horizontal plane.

14. The device according to claim 1,
wherein the plurality of first electrode portion include a first electrode, a second electrode and a third electrode, the first electrode adjacent to the second electrode in the second direction, the first electrode adjacent to the third electrode in the third direction, and
wherein the plurality of second electrode portion include a fourth electrode, a fifth electrode and a sixth electrode, the fourth electrode adjacent to the fifth electrode in the second direction, the fourth electrode adjacent to the sixth electrode in the third direction.

15. The device according to claim 14,
wherein the first electrode is connected to the fourth electrode, the second electrode is connected to the fifth electrode, and the third electrode is connected to the sixth electrode.

* * * * *